(12) United States Patent
Choppalli et al.

(10) Patent No.: US 12,199,147 B2
(45) Date of Patent: Jan. 14, 2025

(54) SEMICONDUCTOR DEVICE INCLUDING A BODY CONTACT REGION AND METHOD OF FORMING THE SAME

(71) Applicant: GlobalFoundries U.S. Inc., Malta, NY (US)

(72) Inventors: Vvss Satyasuresh Choppalli, Malta, NY (US); Anupam Dutta, Malta, NY (US); Aaron Lee Vallett, Malta, NY (US)

(73) Assignee: GlobalFoundaries U.S. Inc., Malta, NY (US)

( * ) Notice: Subject to any disclaimer, the term of this patent is extended or adjusted under 35 U.S.C. 154(b) by 367 days.

(21) Appl. No.: 17/734,135

(22) Filed: May 2, 2022

(65) Prior Publication Data

US 2023/0352536 A1     Nov. 2, 2023

(51) Int. Cl.
*H01L 29/10* (2006.01)
*H01L 21/74* (2006.01)

(52) U.S. Cl.
CPC ........ *H01L 29/1087* (2013.01); *H01L 21/743* (2013.01)

(58) Field of Classification Search
CPC .............. H01L 29/1087; H01L 21/743; H01L 2924/0001–40503; H01L 29/423; H01L 29/107
See application file for complete search history.

(56) References Cited

U.S. PATENT DOCUMENTS

| | | |
|---|---|---|
| 5,818,085 A | 10/1998 | Hsu et al. |
| 6,677,645 B2 | 1/2004 | Bryant et al. |
| 6,963,113 B2 | 11/2005 | Ang et al. |
| 7,553,709 B2 | 6/2009 | Zhu et al. |
| 8,723,265 B2 | 5/2014 | Chen et al. |
| 9,780,117 B2 | 10/2017 | Nygaard et al. |
| 10,832,940 B2 | 11/2020 | Shank et al. |

(Continued)

OTHER PUBLICATIONS

Han et al., "A Scalable Model for the Substrate Resistance in Multi-Finger RF MOSFETs", IEEE MTT-S International Microwave Symposium Digest, 2003, pp. 2105-2108, IEEE.

(Continued)

*Primary Examiner* — Evren Seven
*Assistant Examiner* — Cole Leon Lindsey
(74) *Attorney, Agent, or Firm* — VIERING JENTSCHURA & PARTNER MBB

(57) ABSTRACT

The present disclosure relates to a semiconductor device including a substrate, a first region disposed in the substrate, a terminal region disposed in the first region, a body contact region disposed in the first region and spaced apart from the terminal region, a dielectric layer disposed on the substrate over the first region between the terminal region and the body contact region, an electrically conductive layer disposed on the dielectric layer, and a continuous metallic layer disposed on the electrically conductive layer and extending to the body contact region, the continuous metallic layer disposed on the body contact region and in physical contact with a top and side portions of the electrically conductive layer. The semiconductor device may additionally include a body contact interconnect disposed on a portion of the continuous metallic layer over the electrically conductive layer.

20 Claims, 25 Drawing Sheets

(56) References Cited

U.S. PATENT DOCUMENTS

| | | |
|---|---|---|
| 2003/0222308 A1 | 12/2003 | Su et al. |
| 2012/0205744 A1 | 8/2012 | O et al. |
| 2013/0049013 A1* | 2/2013 | Shimada ........... H01L 21/02639 |
| | | 257/77 |
| 2013/0193526 A1* | 8/2013 | Lo .......................... H01L 29/78 |
| | | 257/E27.06 |
| 2015/0137264 A1 | 5/2015 | Lo et al. |

OTHER PUBLICATIONS

Yuxi et al., "Layout Optimization and Modeling of an ESD-protection n-MOSFET in 0.13um Silicide CMOS Technology", 2008 International Conference on Electronic Packaging Technology & High Density Packaging, 2008, 6 pages, IEEE.

Kang et al., "Scalable Model of Substrate Resistance Components in RF MOSFETs With Bar-Type Body Contact Considered Layout Dimensions", IEEE Electron Device Letters, 2009, pp. 404-406, vol. 30, No. 4, IEEE.

Ker et al., "The Impact of Inner Pickup on ESD Robustness of Multi-Finger NMOS in Nanoscale CMOS Technology", 2006 IEEE International Reliability Physics Symposium Proceedings, 2006, pp. 631-632, IEEE.

\* cited by examiner

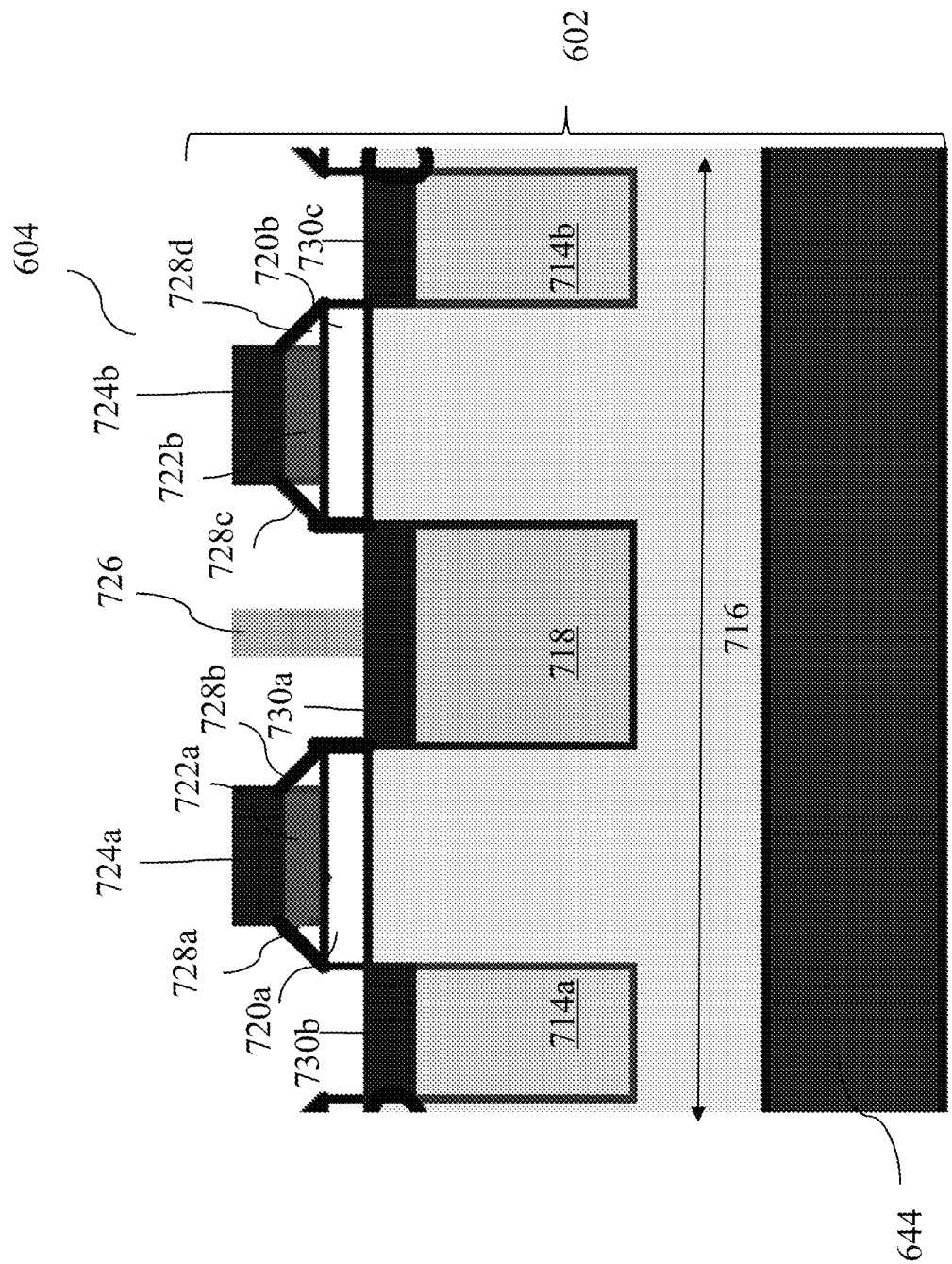

SEMICONDUCTOR DEVICE INCLUDING A BODY CONTACT REGION AND METHOD OF FORMING THE SAME

TECHNICAL FIELD

The present disclosure relates generally to a semiconductor device including a body contact region, as well as a method of forming the same.

BACKGROUND

For transistors formed on silicon-on-insulator (SOI) substrates or substrates having a deep high resistance (HR) layer, the neutral body may be easily depleted before source-drain junction punch through occurs. This effect may degrade device performance, especially for devices such as radio frequency (RF) metal oxide semiconductor field effect transistors (MOSFETs).

SUMMARY

According to an aspect of the present disclosure, there is provided a semiconductor device including a substrate. The semiconductor device may also include a first region disposed in the substrate. The semiconductor device may further include a terminal region disposed in the first region. The semiconductor device may additionally include a body contact region disposed in the first region and spaced apart from the terminal region. The semiconductor device may further include a dielectric layer disposed on the substrate over the first region between the terminal region and the body contact region. The semiconductor device may also include an electrically conductive layer disposed on the dielectric layer. The semiconductor device may further include a continuous metallic layer disposed on the electrically conductive layer and extending to the body contact region, the continuous metallic layer is disposed on the body contact region and in physical contact with a top and side portions of the electrically conductive layer. The semiconductor device may additionally include a body contact interconnect disposed on a portion of the continuous metallic layer over the electrically conductive layer. The first region and the body contact region may have a first conductivity type, and the terminal region may have a second conductivity type different than the first conductivity type.

According to an aspect of the present disclosure, there is provided a method of forming a semiconductor device, including forming a first region in a substrate. The method may also include forming a terminal region in the first region. The method may additionally include forming a body contact region in the first region and spaced apart from the terminal region. The method may further include forming a dielectric layer on the substrate over the first region between the terminal region and the body contact region. The method may also include forming an electrically conductive layer on the dielectric layer. The method may additionally include forming a continuous metallic layer on the electrically conductive layer and extending to the body contact region, the continuous metallic layer is disposed on the body contact region and in physical contact with a top and side portions of the electrically conductive layer. The method may also include forming a body contact interconnect on a portion of the continuous metallic layer over the electrically conductive layer. The first region and the body contact region may have a first conductivity type, and the terminal region may have a second conductivity type different than the first conductivity type.

According to an aspect of the present disclosure, there is provided a semiconductor device including a substrate. The semiconductor device may include a first region disposed in the substrate. The semiconductor device may also include a first terminal region and a second terminal region disposed in the first region. The semiconductor device may further include a body contact region disposed in the first region, the first terminal region and the second terminal region spaced apart from the body contact region so that the body contact region is arranged between the first terminal region and the second terminal region. The semiconductor device may additionally include a first dielectric layer disposed on the substrate over the first region between the first terminal region and the body contact region. The semiconductor device may also include a second dielectric layer disposed on the substrate over the first region between the body contact region and the second terminal region. The semiconductor device may further include a first spacer element, a second spacer element and a first electrically conductive layer disposed on the first dielectric layer such that the first electrically conductive layer is between the first spacer element and the second spacer element. The semiconductor device may also include a third spacer element, a fourth spacer element and a second electrically conductive layer disposed on the second dielectric layer such that the second electrically conductive layer is between the third spacer element and the fourth spacer element. The semiconductor device may additionally include a metallic layer disposed on the body contact region. The semiconductor device may also include a body contact interconnect disposed on the metallic layer. The first region and the body contact region may have a first conductivity type, and the first terminal region and the second terminal region may have a second conductivity type different than the first conductivity type.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same features throughout the different drawings. Also, the drawings are not necessarily to scale, emphasis instead generally being placed upon illustrating the principles of the disclosure. Embodiments of the disclosure will now be illustrated for the sake of example only with reference to the following drawings, in which:

FIG. 5D shows a cross-sectional view the intermediate body contact structure of the semiconductor device according to various non-limiting embodiments of the present disclosure;

DETAILED DESCRIPTION

Figure 1A:
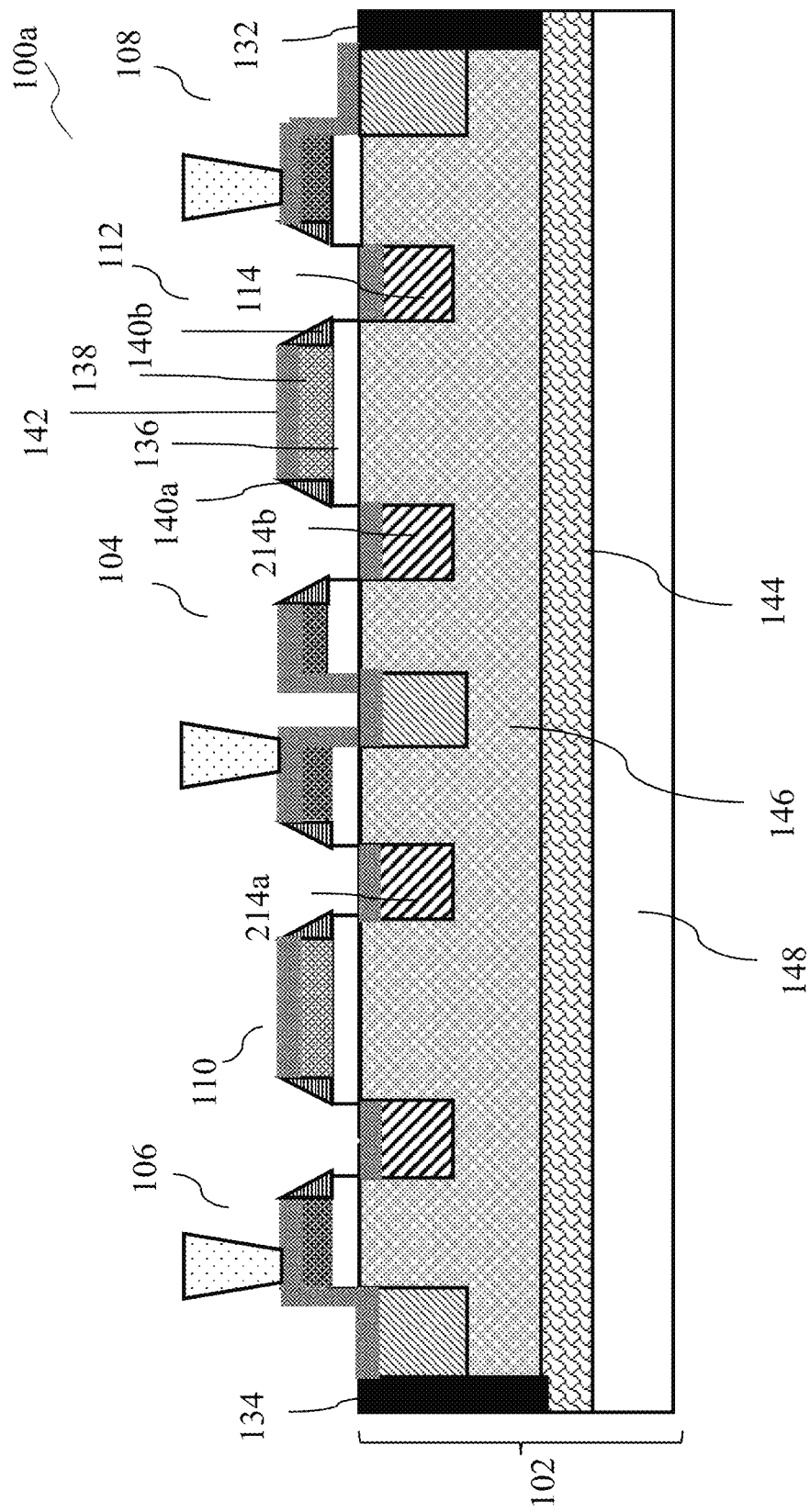
FIG. 1A shows a cross-sectional view of a semiconductor device according to various non-limiting embodiments of the present disclosure.

The embodiments generally relate to semiconductor devices including one or more body contact regions. The semiconductor devices may, for instance, be used as switches or in amplifier applications. The embodiments may also generally relate to methods of forming the semiconductor devices.

Aspects of the present disclosure and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the disclosure in detail. It should be understood, however, that the detailed description and the specific examples, while indicating aspects of the disclosure, are given by way of illustration only, and are not by way of limitation. Various substitutions, modifications, additions, and/or arrangements, within the spirit and/or scope of the underlying inventive concepts will be apparent to those skilled in the art from this disclosure.

The non-limiting embodiments described below in context of the devices are analogously valid for the respective methods, and vice versa. Furthermore, it will be understood that the embodiments described below may be combined; for example, a part of one embodiment may be combined with a part of another embodiment.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value. The word "or" is intended to include "and" unless the context clearly indicates otherwise.

The terminology used herein is for the purpose of describing particular examples only and is not intended to be limiting of the disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

It should be understood that the terms "on", "over", "top", "bottom", "down", "side", "back", "left", "right", "front", "lateral", "vertical", "side", "up", "down" etc., when used in the following description are used for convenience and to aid understanding of relative positions or directions, and not intended to limit the orientation of any device, or structure or any part of any device or structure. Similarly, the term "in" as used herein is not intended to limit a thing to be fully enclosed by something else. Further, the term "width" is intended to mean a length extending in the lateral direction with reference to the relevant drawings; the term "depth" is intended to mean a length extending in the vertical direction with reference to the relevant drawings.

As used herein, the term "connected," when used to refer to two physical elements, means a physical connection between the two physical elements. The term "coupled," however, can mean a physical connection or a connection through one or more intermediary elements. The term "connected" herein may be understood as electrically connected or as mechanically connected, for example attached or fixed, or just in physical contact without any fixation. The term "coupled" herein may be understood as electrically coupled or as mechanically coupled, for example attached or fixed, or just in contact without any fixation, and it will be understood that both coupling with physical contact or coupling without physical contact may be provided.

According to various non-limiting embodiments, a semiconductor device may include a substrate. The semiconductor device may also include a first region disposed in the substrate. The semiconductor device may further include a terminal region disposed in the first region. The semiconductor device may additionally include a body contact region disposed in the first region and spaced apart from the terminal region. The semiconductor device may further include a dielectric layer disposed on the substrate over the first region between the terminal region and the body contact region. The semiconductor device may also include an electrically conductive layer disposed on the dielectric layer. The semiconductor device may further include a continuous metallic layer disposed on the electrically conductive layer and extending to the body contact region, the continuous metallic layer is disposed on the body contact region and in physical contact with a top and side portions of the electrically conductive layer. The semiconductor device may additionally include a body contact interconnect disposed on a portion of the continuous metallic layer over the electrically conductive layer. The first region and the body contact region may have a first conductivity type, and the terminal region may have a second conductivity type different than the first conductivity type.

According to various non-limiting embodiments, the semiconductor device may further include a second terminal region disposed in the first region and spaced apart from the body contact region, so that the body contact region is arranged between the terminal region and the second terminal region. The semiconductor device may also include a second dielectric layer disposed on the substrate over the first region between the second terminal region and the body contact region. The semiconductor device may further include a second electrically conductive layer disposed on the second dielectric layer. The continuous metallic layer may be disposed on the second electrically conductive layer so that the continuous metallic layer further extends from the body contact region to the second electrically conductive layer, the continuous metallic layer in physical contact with a top and side portions of the second electrically conductive layer. The second terminal region may have the second conductivity type.

According to various non-limiting embodiments, the semiconductor device may also include a second body contact interconnect disposed on a portion of the continuous metallic layer over the second electrically conductive layer.

According to various non-limiting embodiments, the continuous metallic layer may include a metal silicide.

According to various non-limiting embodiments, the dielectric layer may include an oxide and the electrically conductive layer may include polysilicon.

According to various non-limiting embodiments, the semiconductor device may also include a spacer element disposed on the dielectric layer and on a side of the electrically conductive layer, wherein the electrically conductive layer is disposed on a first portion of the dielectric layer and the spacer element is disposed on a second portion of the dielectric layer, the first portion nearer to the body contact region and the second portion nearer to the terminal region.

According to various non-limiting embodiments, the semiconductor device may further include a trench isolation region disposed adjacent to the body contact region, on a side of the body contact region facing away from the terminal region.

According to various non-limiting embodiments, the semiconductor device may also include a second spacer element disposed on the second dielectric layer and on a side of the second electrically conductive layer, wherein the second electrically conductive layer is disposed on a first portion of the second dielectric layer and the second spacer element is disposed on a second portion of the second dielectric layer, the first portion nearer to the body contact region and the second portion nearer to the terminal region.

According to various non-limiting embodiments, the terminal region may be part of a first array of transistors and the second terminal region may be part of a second array of transistors. Each transistor of the first array of transistors may include a gate structure extending in parallel to the first electrically conductive layer and to the second electrically conductive layer, and each transistor of the second array of transistors may include a gate structure extending in parallel to the first electrically conductive layer and to the second electrically conductive layer.

According to various non-limiting embodiments, a number of transistors in the first array of transistors may be an odd number and a number of transistors in the second array of transistors may be an odd number.

According to various non-limiting embodiments, a number of transistors in the first array of transistors may be an even number and a number of transistors in the second array of transistors may be an even number.

According to various non-limiting embodiments, a semiconductor device that facilitates an improved body contact arrangement for body biasing is provided. The improved body contact arrangement may provide greater uniformity of body biasing in multifinger transistor structures.

According to various non-limiting embodiments, transistors in the first array of transistors and transistors in the second array of transistors may be fingers of a multifinger transistor structure.

According to various non-limiting embodiments, the semiconductor device may include a second region disposed in the substrate. The semiconductor device may also include a third terminal region disposed in the second region. The semiconductor device may further include a second body contact region disposed in the second region and spaced apart from the third terminal region. The semiconductor device may also include a third dielectric layer disposed on the substrate over the second region between the third terminal region and the second body contact region. The semiconductor device may further include a third electrically conductive layer disposed on the third dielectric layer. The semiconductor device may also include a second continuous metallic layer disposed on the third electrically conductive layer and extending to the second body contact region, the second continuous metallic layer in physical contact with a top and side portions of the third electrically conductive layer. The semiconductor device may also include a third body contact interconnect disposed on a portion of the second continuous metallic layer over the third electrically conductive layer. The second region and the second body contact region may have the first conductivity type, and the third terminal region may have the second conductivity type.

According to various non-limiting embodiments, the third terminal region may be part of the first array of transistors such that the first array of transistors is between the first body contact region and the second body contact region.

According to various non-limiting embodiments, the semiconductor device may also include a third region disposed in the substrate. The semiconductor device may also include a fourth terminal region disposed in the third region. The semiconductor device may further include a third body contact region disposed in the third region and spaced apart from the fourth terminal region. The semiconductor device may also include a fourth dielectric layer disposed on the substrate over the third region between the fourth terminal region and the third body contact region. The semiconductor device may additionally include a fourth electrically conductive layer disposed on the third dielectric layer. The semiconductor device may also include a third continuous metallic layer disposed on the fourth electrically conductive layer and extending to the third body contact region, the third continuous metallic layer in physical contact with a top and side portions of the fourth electrically conductive layer. The semiconductor device may further include a fourth body contact interconnect disposed on a portion of the third continuous metallic layer over the fourth electrically conductive layer. The third region and the third body contact region may have the first conductivity type, and the fourth terminal region may have the second conductivity type.

In various non-limiting embodiments, the fourth terminal region may be part of the second array of transistors such that the second array of transistors may be between the first body contact region and the third body contact region.

In various non-limiting embodiments, the semiconductor device may also include a buried high resistance or high impedance region, or an oxide layer in the substrate under the first region. The oxide layer may be a silicon oxide layer of a silicon-on-insulator (SOI) substrate.

In various non-limiting embodiments, the semiconductor device may also include an electrically conductive buried region of the substrate in electrical connection with the body contact region.

According to various non-limiting embodiments, a method of forming a semiconductor device may be provided. The method may include forming a first region in a substrate. The method may also include forming a terminal region in the first region. The method may additionally include forming a body contact region in the first region and spaced apart from the terminal region. The method may further include forming a dielectric layer on the substrate over the first region between the terminal region and the body contact region. The method may also include forming an electrically conductive layer on the dielectric layer. The method may additionally include forming a continuous metallic layer on the electrically conductive layer and extending to the body contact region, the continuous metallic layer is disposed on the body contact region and in physical contact with a top and side portions of the electrically conductive layer. The method may also include forming a body contact interconnect on a portion of the continuous metallic layer over the electrically conductive layer. The first region and the body contact region may have a first conductivity type, and the terminal region may have a second conductivity type different than the first conductivity type.

According to various non-limiting embodiments, a semiconductor device may be provided. The semiconductor device may include a substrate. The semiconductor device may further include a first region disposed in the substrate. The semiconductor device may also include a first terminal region and a second terminal region disposed in the first region. The semiconductor device may further include a body contact region disposed in the first region, the first terminal region and the second terminal region spaced apart from the body contact region so that the body contact region is arranged between the first terminal region and the second terminal region. The semiconductor device may additionally include a first dielectric layer disposed on the substrate over the first region between the first terminal region and the body contact region. The semiconductor device may also include a second dielectric layer disposed on the substrate over the first region between the body contact region and the second terminal region. The semiconductor device may further include a first spacer element, a second spacer element and a first electrically conductive layer disposed on the first dielectric layer such that the first electrically conductive layer is between the first spacer element and the second spacer element. The semiconductor device may also include a third spacer element, a fourth spacer element and a second electrically conductive layer disposed on the second dielectric layer such that the second electrically conductive layer is between the third spacer element and the fourth spacer element. The semiconductor device may additionally include a metallic layer disposed on the body contact region. The semiconductor device may also include a body contact interconnect disposed on the metallic layer. The first region and the body contact region may have a first conductivity type, and the first terminal region and the second terminal region may have a second conductivity type different than the first conductivity type.

According to various non-limiting embodiments, the first terminal region may be part of a first array of transistors and the second terminal region may be part of a second array of transistors.

FIG. 1A shows a cross-sectional view of a semiconductor device 100a according to various non-limiting embodiments of the present disclosure. To avoid clutter, similar features may not all be labeled with reference numerals. The semiconductor device 100a may include a substrate 102, as well as an intermediate body contact structure 104 and end body contact structures 106, 108. The semiconductor device 100a may further include a first transistor 110 between the intermediate body contact structure 104 and the end body contact structure 106, as well as a second transistor 112 between the intermediate body contact structure 104 and the end body contact structure 108.

Figure 1B:
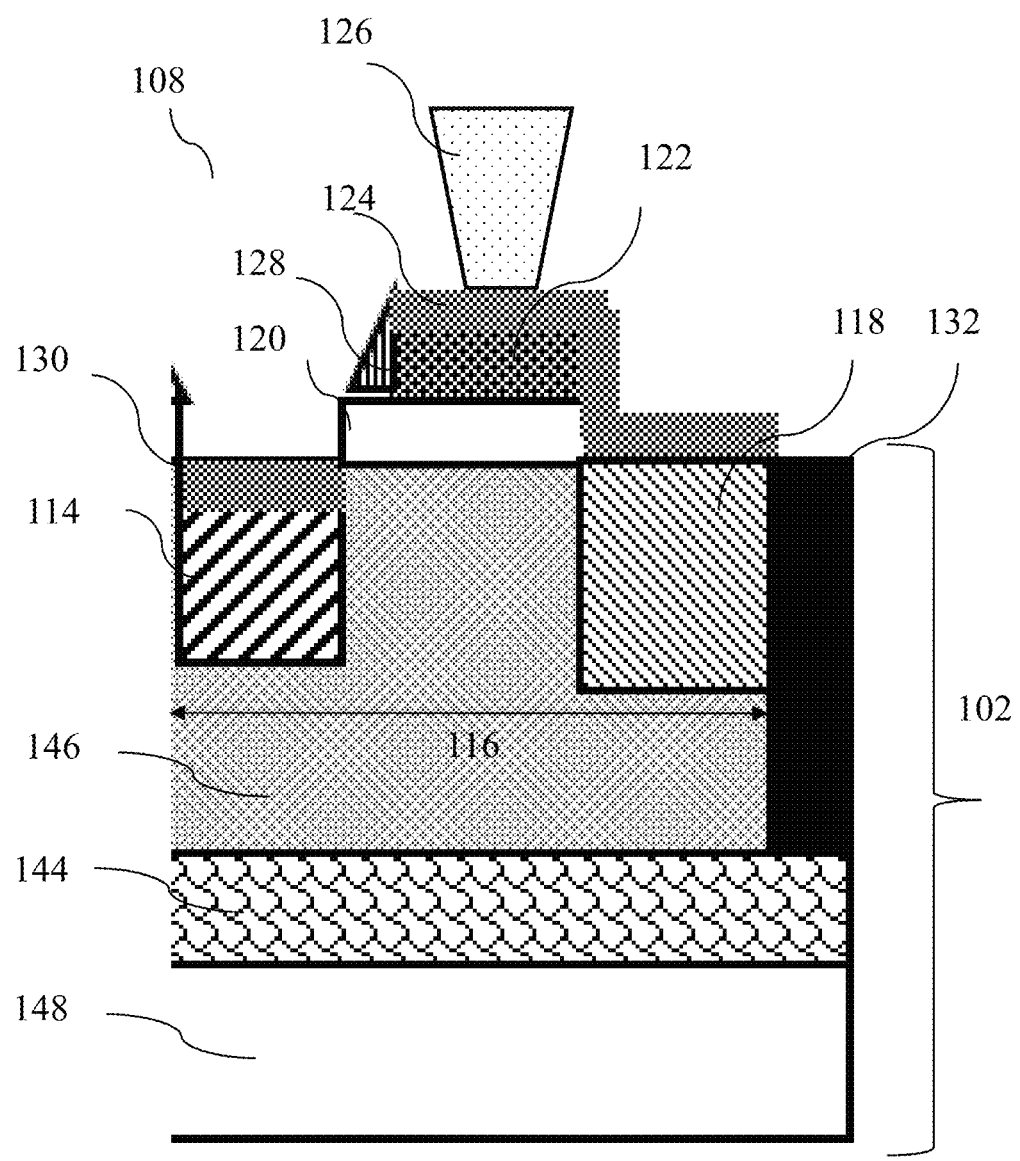
FIG. 1B shows a cross-sectional view of an end body contact structure of the semiconductor device according to various non-limiting embodiments of the present disclosure.
Figure 1C:
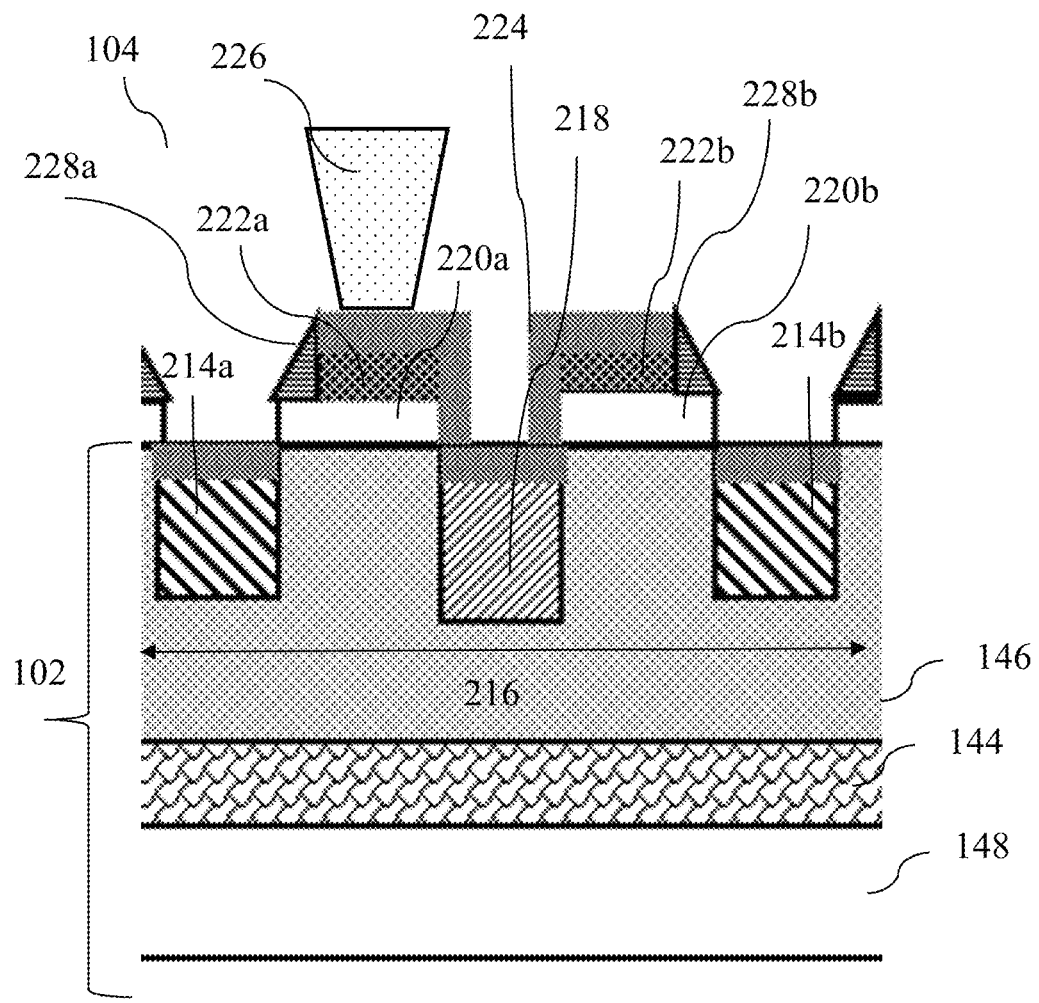
FIG. 1C shows a cross-sectional view of an intermediate body contact structure of the semiconductor device according to various non-limiting embodiments of the present disclosure.

FIG. 1B shows a cross-sectional view of the end body contact structure 108 according to various non-limiting embodiments of the present disclosure. FIG. 1C shows a cross-sectional view of the intermediate body contact structure 104 according to various non-limiting embodiments of the present disclosure.

The end body contact structure 108 may include a terminal region 114 disposed in a region 116, as well as a body contact region 118, which is disposed in the region 116 and spaced apart from the terminal region 114. The region 116 and the body contact region 118 may have a first conductivity type, and the terminal region 114 may have a second conductivity type different than the first conductivity type. The first conductivity type may be P-doped, while the second conductivity-type may be N-doped, meaning that the region 116 and the body contact region 118 may be P-doped, while the terminal region 114 may be N-doped. However, in various other embodiments, the first conductivity type may be N-doped, while the second conductivity-type may be P-doped. The concentration of the dopants in the body contact region 118 may be higher than the concentration of the dopants in the region 116. For instance, the concentration of dopants in the body contact region 118 may be any value higher than $10^{18}$ cm$^{-3}$, while the concentration of dopants in the region 116 may be any value lower than $10^{17}$ cm$^{-3}$.

The end body contact structure 108 may include a dielectric layer 120 disposed on the substrate 102 over the region 116 between the terminal region 114 and the body contact region 118. The dielectric layer 120 may include an oxide, such as silicon oxide, aluminum oxide or hafnium oxide. In various other embodiments, the dielectric layer 120 may include another suitable dielectric material 120 such as silicon nitride or silicon oxynitride. The end body contact structure 108 may additionally include an electrically conductive layer 122 disposed on the dielectric layer 120. The electrically conductive layer 122 may include a semiconductor material such as polysilicon. In various other embodiments, the electrically conductive layer 122 may include another conductive material, such as metals or alloys, for example titanium nitride (TiN), tantalum nitride (TaN) or tungsten (W).

The end body contact structure 108 may further include a continuous metallic layer 124 disposed on the electrically conductive layer 122 and extending to the body contact region 118, the continuous metallic layer 124 in physical contact with a top and side portions of the electrically conductive layer 122. The end body contact structure 108 may additionally include a body contact interconnect 126 disposed on a portion of the continuous metallic layer 124 over the electrically conductive layer 122. The continuous metallic layer 124 may include a suitable metal silicide such as molybdenum silicide (MoSi$_2$), tungsten silicide (WSi$_2$), tantalum silicide (TaSi$_2$) or chromium silicide (CrSi$_2$). In various other non-limiting embodiments, continuous metallic layer 124 may include another electrically conductive material such as a metal (e.g. aluminum or gold) or a metallic alloy. The body contact interconnect 126 may include an electrically conductive material, for instance, a metal such as aluminum or copper.

The end body contact structure 108 may additionally include a spacer element 128 disposed on the dielectric layer 120 and on a side of the electrically conductive layer 122. The cross-section of the spacer element 128 may be of any suitable shape, e.g. triangular or a segment with a curved outer side. The electrically conductive layer 122 may be disposed on a first portion of the dielectric layer 120 and the spacer element 128 may be disposed on a second portion of the dielectric layer 120, the first portion nearer to the body contact region 118 and the second portion nearer to the terminal region 114. The spacer element 128 may include a suitable dielectric material such as silicon nitride. The end body contact structure 108 may also include another metallic layer 130 on the terminal region 114. The metallic layer 130 may include the same material as the material of the continuous metallic layer 124, or may include a material that is different from the material of the continuous metallic layer 124. The metallic layer 130 may include a metal silicide such as molybdenum silicide (MoSi$_2$), tungsten silicide (WSi$_2$), tantalum silicide (TaSi$_2$) or chromium silicide (CrSi$_2$), a metal such as aluminum or gold, or a metallic alloy. The semiconductor device 100a may include a trench isolation region 132 disposed adjacent to the body contact region 118, on a side of the body contact region 118 facing away from the terminal region 114.

The end body contact structure 106 may have similar features as the end body contact structure 108. Likewise, the semiconductor device 100a may include a trench isolation region 134 disposed adjacent to the body contact region of the end body contact structure 106, on a side of the body contact region facing away from the terminal region of the end body contact structure 106.

The intermediate body contact structure 104 may include a body contact region 218, as well as terminal regions 214a, 214b disposed in a region 216. The terminal regions 214a, 214b may be spaced apart from the body contact region 218, so that the body contact region 218 is arranged between the terminal regions 214a, 214b. In various embodiments, the body contact region 218 and the region 216 may be P-doped, while the terminal regions 214a, 214b may be N-doped. In various other embodiments, the body contact region 218 and the region 216 may be N-doped, while the terminal regions 214a, 214b may be P-doped. The concentration of the dopants in the body contact region 218 may be higher than the concentration of the dopants in the region 216. For instance, the concentration of dopants in the body contact region 218 may be any value higher than $10^{18}$ cm$^{-3}$, while the concentration of dopants in the region 216 may be any value lower than $10^{17}$ cm$^{-3}$.

The intermediate body contact structure 104 may also include a dielectric layer 220a disposed on the substrate 102 over the region 216 between the terminal region 214a and the body contact region 218, as well as another dielectric layer 220b disposed on the substrate 102 over the region 216 between the terminal region 214b and the body contact region 218. The intermediate body contact structure 104 may additionally include an electrically conductive layer 222a disposed on the dielectric layer 220a, and another electrically conductive layer 222b disposed on the dielectric layer 220b. The dielectric layers 222a, 222b may include an oxide, such as silicon oxide, aluminum oxide or hafnium oxide, or another suitable dielectric material such as silicon nitride or silicon oxynitride.

The intermediate body contact structure 104 may also include a continuous metallic layer 224 disposed on the electrically conductive layer 222a and extending to the body contact region 218, and further extending from the body contact region 218 to the electrically conductive layer 222b. The continuous metallic layer 224 may be in physical contact with a top and side portions of the electrically conductive layer 222a as well as with a top and side portions of the electrically conductive layer 222b. FIG. 1C shows the intermediate body contact structure 104 includes a body contact interconnect 226 disposed on a portion of the continuous metallic layer 224 over the electrically conductive layer 222a. In various other non-limiting embodiments, the body contact interconnect 226 may be disposed on a portion of the continuous metallic layer 224 over the electrically conductive layer 222b. In yet various other non-limiting embodiments, in addition to the body contact interconnect 226 disposed on the portion of the continuous metallic layer 224 over the electrically conductive layer 222a, there may be another body contact interconnect disposed on the portion of the continuous metallic layer 224 over the electrically conductive layer 222b. The continuous metallic layer 224 may include a suitable metal silicide such as molybdenum silicide ($MoSi_2$), tungsten silicide ($WSi_2$), tantalum silicide ($TaSi_2$) or chromium silicide ($CrSi_2$). In various other embodiments, the continuous metallic layer 224 may include another electrically conductive material such as a metal (e.g. aluminum or gold) or a metallic alloy. The body contact interconnect(s) 226 may include an electrically conductive material, for instance a metal such as aluminum or copper. The intermediate body contact structure 104 may additionally include a spacer element 228a disposed on the dielectric layer 220a and on a side of the electrically conductive layer 222a, and another spacer element 228b disposed on the dielectric layer 220b and on a side of the electrically conductive layer 222b. The spacer elements 228a, 228b may include a suitable dielectric material such as silicon nitride. The electrically conductive layer 222a may be disposed on a first portion of the dielectric layer 220a and the spacer element 228a may be disposed on a second portion of the dielectric layer 220a, the first portion nearer to the body contact region 218 and the second portion nearer to the terminal region 214a. Likewise, the electrically conductive layer 222b may be disposed on a first portion of the dielectric layer 220b and the spacer element 228b may be disposed on a second portion of the dielectric layer 220b, the first portion nearer to the body contact region 218 and the second portion nearer to the terminal region 214b.

Referring back to FIG. 1A, the first transistor 110 and the second transistor 112 may be conventional transistors, e.g. metal oxide semiconductor field effect transistors (MOSFETs). In various non-limiting embodiments, the first transistor 110 and the second transistor 112 may be different fingers of a multifinger transistor structure. For instance, the second transistor 112 may include terminal regions 114, 214b, a dielectric layer 136 on the substrate 102, an electrically conductive layer 138 and spacer elements 140a, 140b on the dielectric layer 136, as well as a metallic layer 142 on the electrically conductive layer 138. The electrically conductive layer 138 may be between the spacer elements 140a, 140b. The terminal region 114 of the second transistor 112 may also be the terminal region of the end body contact structure 108, while the terminal region 214b of the second transistor 112 may also be the terminal region of the intermediate body contact structure 104.

The first transistor 110 may have similar features as the second transistor 112. The terminal region 214a of the first transistor 110 may also be the terminal region of the intermediate body contact structure 104, while another terminal region of the first transistor 110 may also be the terminal region of the end body contact structure 106.

The semiconductor device 100a may also include a buried insulating region 144, such as an oxide layer or a buried high resistance (also referred to as high impedance) region. Generally, the substrate 102 may be a crystal-on-insulator substrate, a silicon-on-insulator (SOI) substrate, or any substrate in which the top silicon is separated from the bottom handle wafer by any means. The semiconductor device 100a may also include regions 146, 148 such that the buried insulating region 144 is between the region 146 and the region 148. The region 146 may include the regions 116 and 216 shown in FIGS. 1B-C, and may be of the first conductivity type. A high resistance region may refer to a region having an impedance of at least approximately ten megaohms (MΩ). In order to form a high resistance region, crystalline semiconductor material may be formed on, or converted from, other portions of the substrate 102. The crystalline semiconductor material may be converted into polycrystalline semiconductor material, e.g. polycrystalline silicon, through any currently known or later developed process to form high resistance regions, e.g. creating a high resistance amorphous layer or region through implants, annealing, and/or other operations. In this regard, polycrystalline semiconductor material may refer to any multi crystalline thin-film semiconductor that features no long-range crystallographic order. The polycrystalline material may provide electrical insulation as compared to single-crystals. In various other non-limiting embodiments, the polycrystalline semiconductor material may be formed from amorphous semiconductor material, e.g. amorphous silicon. In some cases, the high resistance region may include some remaining amorphous semiconductor material. The regions 146, 148 may include single-crystals, e.g. crystalline silicon.

Figure 1D:
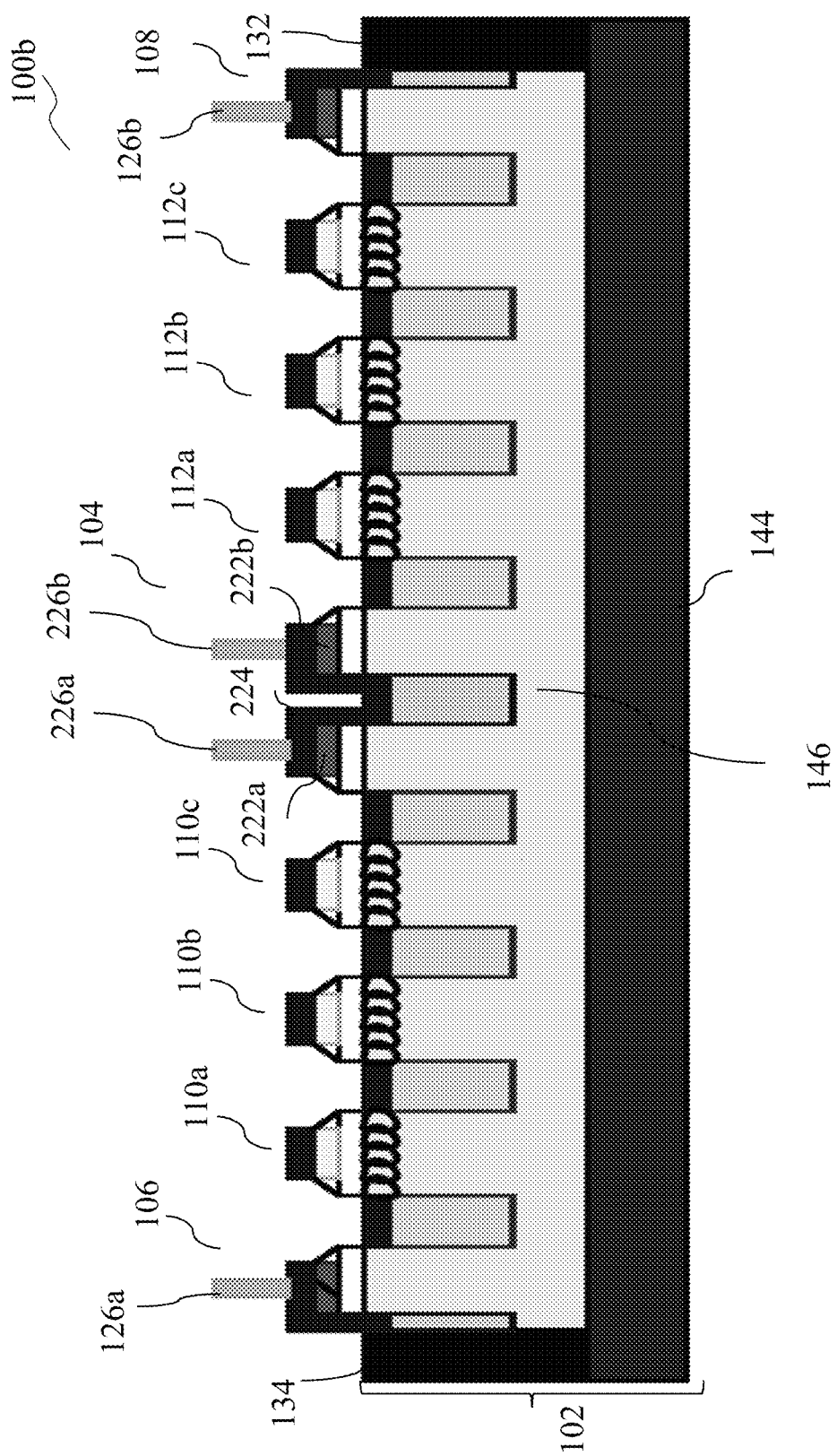
FIG. 1D shows a cross-sectional view of the semiconductor device according to various non-limiting embodiments of the present disclosure.
Figure 1E:
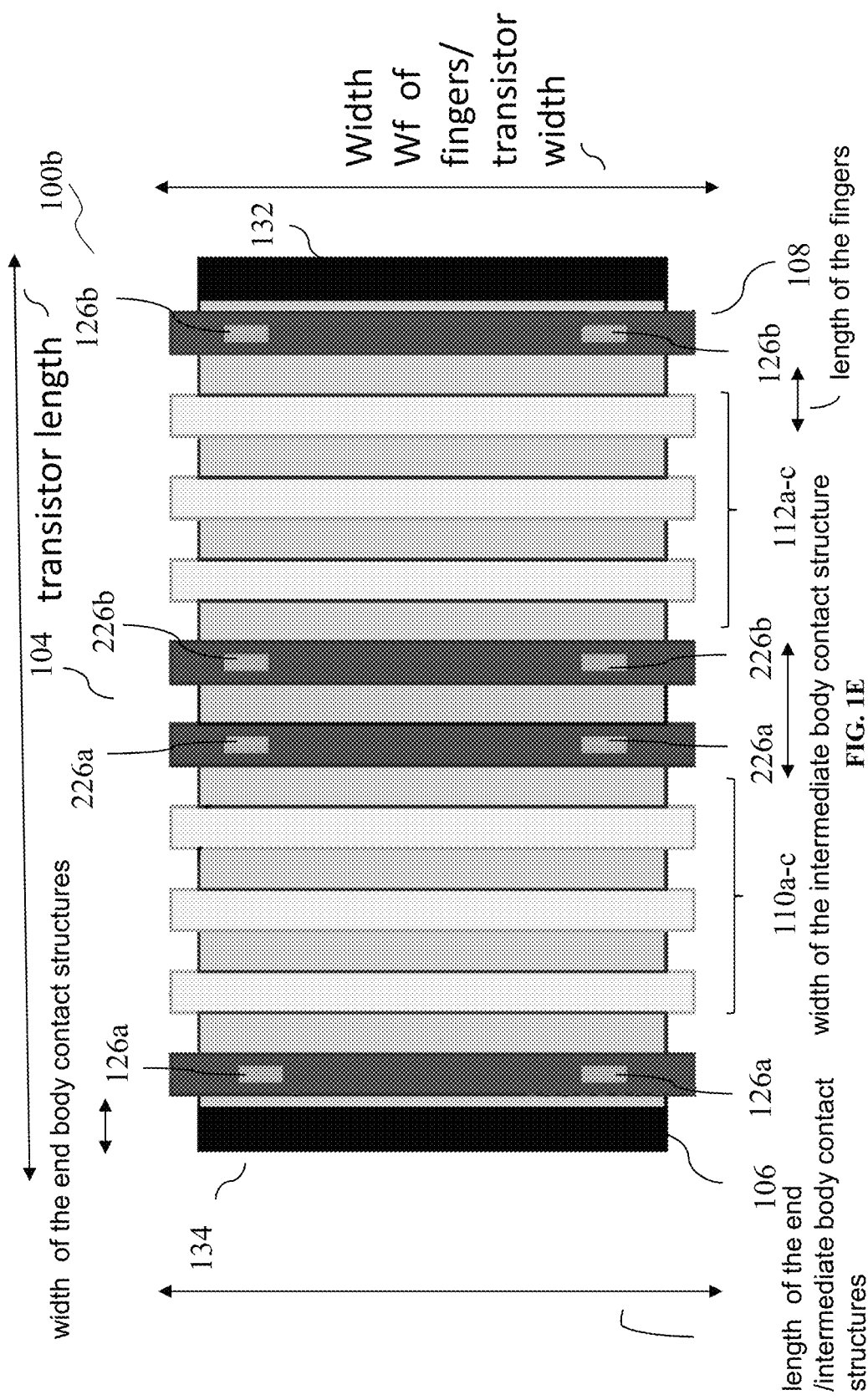
FIG. 1E shows a top planar view of the semiconductor device according to various non-limiting embodiments of the present disclosure.

FIG. 1D shows a cross-sectional view of a semiconductor device 100b according to various non-limiting embodiments of the present disclosure. FIG. 1E shows a top planar view of the semiconductor device 100b according to various non-limiting embodiments of the present disclosure. The semiconductor device 100b may be similar to the semiconductor device 100a but with a plurality of first transistors 110a-c forming a first array of transistors, and a plurality of second transistors 112a-c forming a second array of transistors. The intermediate body contact structure 104 may be between the first transistors 110a-c and the second transistors 112a-c. Each of the transistors of the first and second array of transistors may be individual fingers of a multifinger transistor structure.

In addition, the intermediate body contact structure 104 may include body contact interconnects 226a disposed on the portion of the continuous metallic layer 224 over the electrically conductive layer 222a of the intermediate body contact structure 104, and body contact interconnects 226b disposed on the portion of the continuous metallic layer 224 over the electrically conductive layer 222b of the intermediate body contact structure 104. The body contact interconnects 226a, 226b may be arranged along the length of intermediate body contact structure 104 as shown in FIG. 1E. Likewise, body contact interconnects 126a may be arranged along the length of the end body contact structure 106, while body contact interconnects 126b may be arranged along the length of the end body contact structure 108.

The body contact interconnects 226a, 226b of the of intermediate body contact structure 104 as well as the body contact interconnects 126a of the end body contact structure 106 and the body contact interconnects 126b of the second single body contact 108 may be biased with the desired body voltage. The semiconductor device 100a, 100b may include an interconnection electrically connecting body contact interconnects 226a, 226b, 126a and/or 126b. On the other hand, a desired gate voltage may be applied to the gate structures of the first transistors 110a-c and the gate structures of the second transistors 112a-c. The semiconductor device 100a, 100b may include one or more other interconnections electrically connecting the gate structures of the first transistors 110a-c and the gate structures of the second transistors 112a-c. The desired gate voltage may be different from the desired body voltage. In other words, the semiconductor device 100a, 100b may include a set of circuitry for connecting to body contact interconnects 226a, 226b, 126a and/or 126b to provide the desired body voltage, and a separate set of circuitry for connecting to the gate structures of the first transistors 110a-c and the gate structures of the second transistors 112a-c to provide the desired gate voltage.

As shown in FIG. 1E, each of first transistors 110a-c may include a gate structure extending in parallel to the electrically conductive layers 222a, 222b of the intermediate body contact structure 104 and to the electrically conductive layer of the end body contact structure 106 and the electrically conductive layer 122 of the end body contact structure 108. Likewise, each of second transistors 112a-c may include a gate structure extending in parallel to the electrically conductive layers 222a, 222b of the intermediate body contact structure 104 and to the electrically conductive layer of the end body contact structure 106 and to the electrically conductive layer 122 of the end body contact structure 108. The gate structures of the first transistors 110a-c and the second transistors 112a-c may form fingers of the semiconductor device 100b.

While FIGS. 1D-1E show three first transistors 110a-c and three second transistors 112a-c, other embodiments may include any number of first transistors and any number of second transistors. In various non-limiting embodiments, the first transistors and the second transistors may be different fingers of a multifinger transistor structure. In various non-limiting embodiments, a number of transistors in the first array of transistors may be an odd number and a number of transistors in the second array of transistors may be an odd number, thereby forming a symmetric device, e.g. for switch applications. A symmetric device may include an odd number of transistors between neighboring body contact structures. In various other non-limiting embodiments, a number of transistors in the first array of transistors may be an even number and a number of transistors in the second array of transistors may be an even number, thereby forming an asymmetric device, e.g. for amplifier applications. An asymmetric device may include an even number of transistors between neighboring body contact structures.

The multi-finger transistor as shown in FIG. 1E may provide for more effective and uniform biasing along both the transistor length and transistor width directions. A multi-finger transistor may include at least two body contact structures (e.g., end body contact structures 106, 108). A multifinger transistor may further include one or more intermediate body contact structures 104. An intermediate body contact structure may be disposed between two fingers of the multifinger transistor and distributed at intervals along a length of the transistor. Each body contact structure (e.g., the intermediate body contact structure 104 and the end body contact structures 106, 108) may include a plurality of body contact interconnects 126, 226 distributed spaced apart from each other. For example, the plurality of body contact interconnects may be arranged and distributed in the body contact structure along a width of a finger. Each elongated end body contact structure 106, 108 or the elongated intermediate body contact structure 104 extending across the transistor width may provide more uniform biasing along the transistor width direction as compared to conventional devices such as a T-gate. Further, the distribution of the plurality of body contact interconnects 126, 226 along a width of the fingers may provide more uniform biasing along the transistor width direction. The more uniform biasing may improve threshold cutoff frequency (fT), and also lead to better current-voltage (I-V) linearity. Additionally, with the more uniform biasing, fingers of larger width ($W_f$) may be used, thereby reducing wiring complexity.

The arrangement of the body contact structures along the length of the transistor may provide more effective and uniform body voltage biasing. That is, the multiple body contact interconnects 226a, 226b along the lengths of the intermediate body contact structure 104 and the multiple body contact interconnects 126a, 126b along the lengths of the end body contact structures 106, 108 may provide more effective and uniform body voltage biasing along the width of the fingers of the semiconductor device 100b, while the provision of one or more intermediate body contact structures 104 together with the two end body contact structures 106, 108 (as well as the associated interconnects 126, 226) may provide more effective and uniform body voltage biasing along the transistor length. The multiple body contact interconnects 226a, 226b and the multiple body contact interconnects 126a, 126b may be electrically connected to a single terminal such that a voltage or bias applied to the terminal may be applied to the multiple body contact interconnects 226a, 226b and the multiple body contact interconnects 126a, 126b.

Figure 1F:
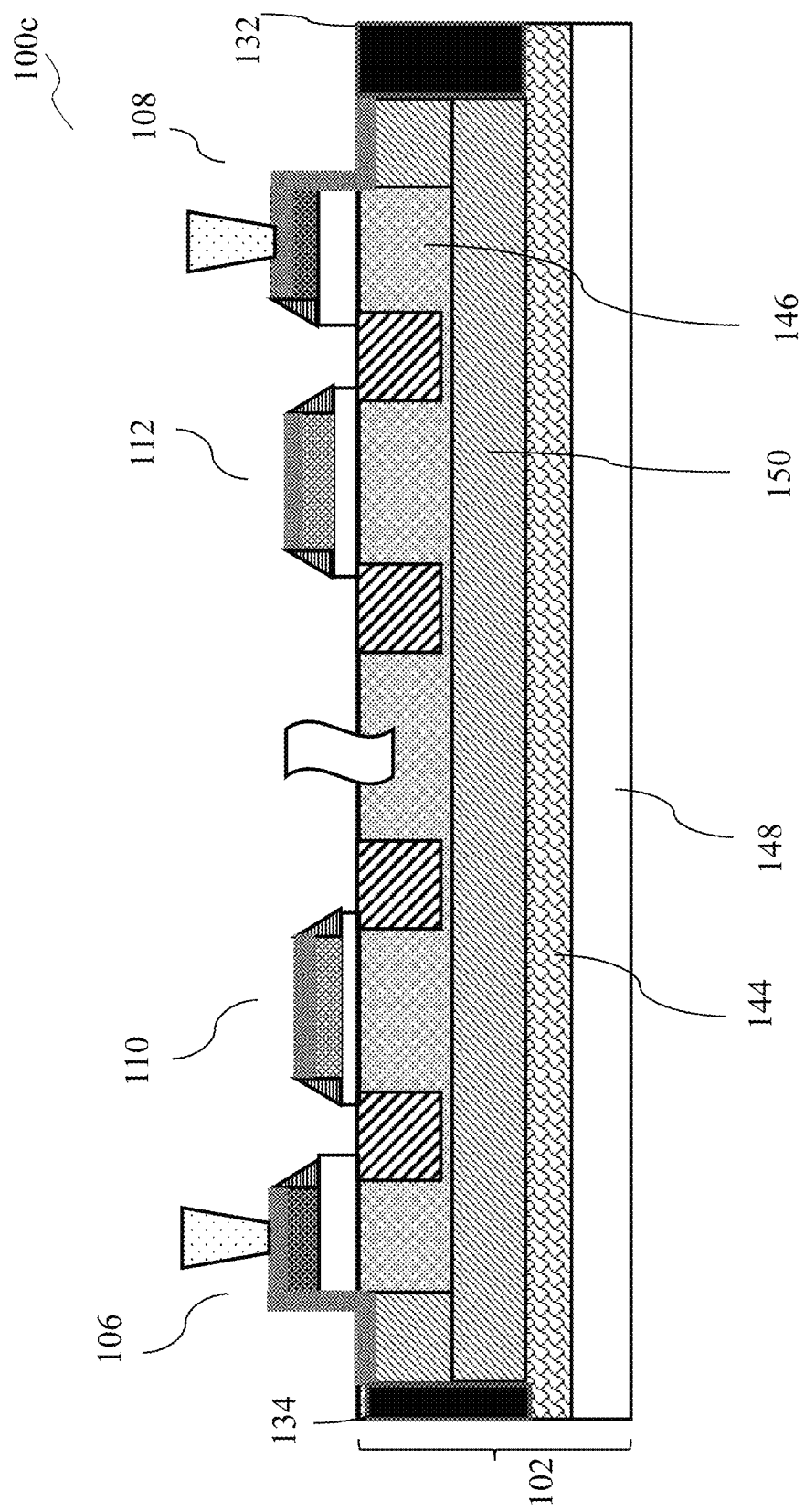
FIG. 1F shows another cross-sectional view of the semiconductor device according to various non-limiting embodiments of the present disclosure.
Figure 1G:
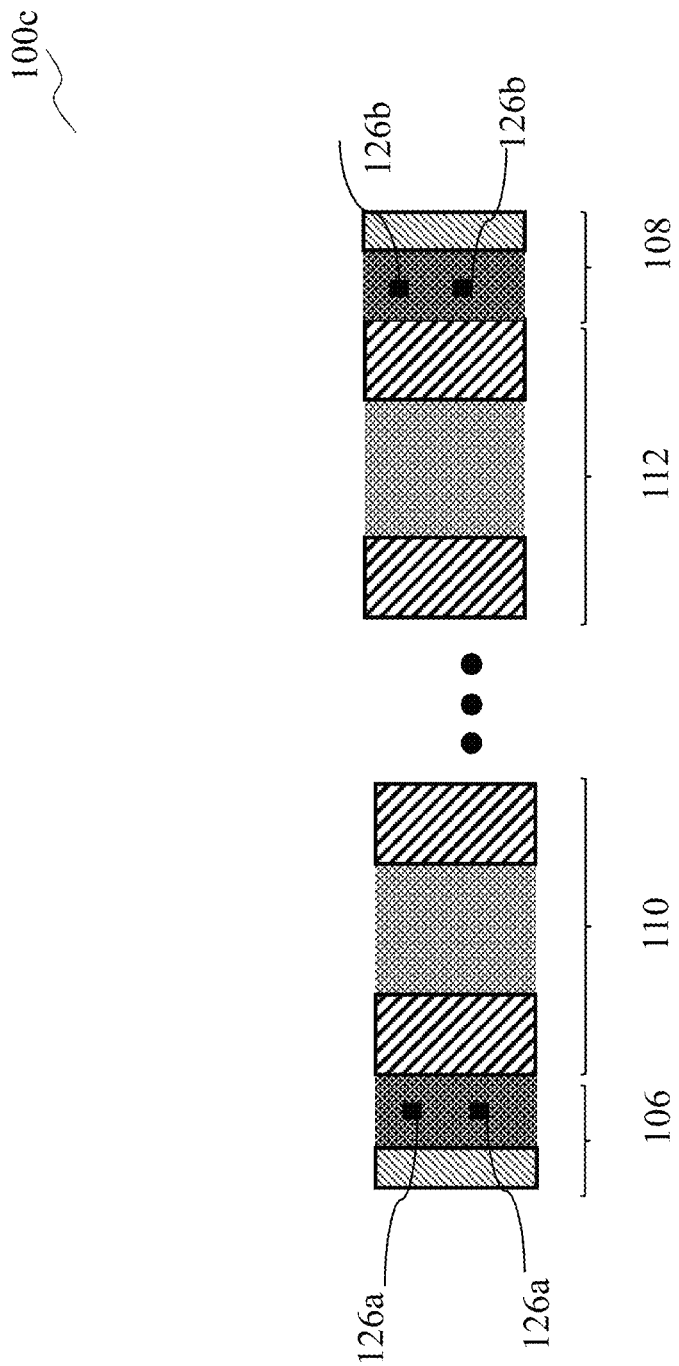
FIG. 1G shows another top planar view of the semiconductor device according to various non-limiting embodiments of the present disclosure.

FIG. 1F shows a cross-sectional view of a semiconductor device 100c according to various non-limiting embodiments of the present disclosure. FIG. 1G shows a top planar view of the semiconductor device 100c according to various non-limiting embodiments of the present disclosure. The middle portion of the semiconductor device 100c is not shown in FIGS. 1F-1G. In various other non-limiting embodiments, the semiconductor device 100c may not include any intermediate body contact structure between the end body contact structures 106, 108. In various non-limiting embodiments, the semiconductor device 100c may include one or more intermediate body contact structures between the end body contact structures 106, 108. A frequency or interval of the placement of the intermediate body contact structure 104 may depend on a size of each transistor finger and the number of transistor fingers. A greater number of intermediate body contact structures 104 may provide even more uniform biasing of the body voltage along the transistor length. There may be no limit on the number of the intermediate body contact structures, or the frequency in which the intermediate body contact structure is repeated in the semiconductor device 100c. In various non-limiting embodiments, the intermediate body structure may be repeated every 3 to 7 fingers.

Additionally, the semiconductor device 100c may be similar to semiconductor devices 100a, 100b but may include an electrically conductive buried region 150 of the substrate 102 in electrical connection with the body contact regions of the end body contact structures 106, 108 as well as the body contact region of the intermediate body contact structure(s). The electrically conductive buried region 150 may be a doped region and may have the first conductivity type, such as a P+ deep implant layer. The concentration of the dopants in the electrically conductive buried region 150 may be higher than the concentration of the dopants in the region 146. The electrically conductive buried region 150 may be between the buried insulating region 144 and crystalline region 146. The electrically conductive buried region 150 may provide a low resistance path, and may provide more uniform body voltage biasing to transistors 110, 112.

Figure 2A:
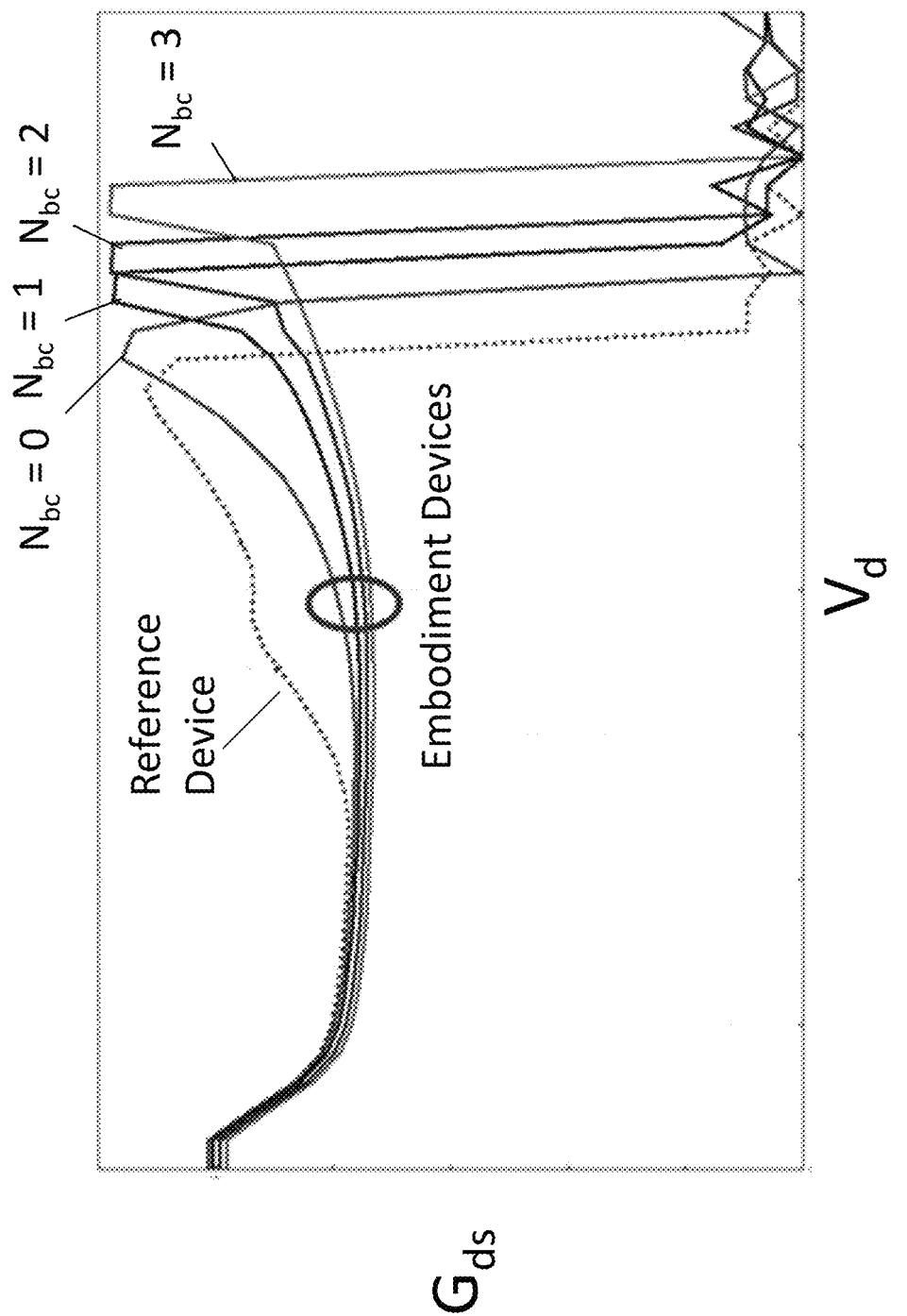
FIG. 2A shows a plot of channel conductance ($G_{ds}$) as a function of drain voltage ($V_d$) of a reference device as well as various semiconductor devices including 0-3 intermediate body contact structures according to various non-limiting embodiments.

FIG. 2A shows a plot of channel conductance ($G_{ds}$) as a function of drain voltage ($V_d$) of a reference device as well as various semiconductor devices including 0-3 intermediate body contact structures according to various non-limiting embodiments. The reference device does not have intermediate body contact structures and end body contact structures, while the various embodiment devices have end body contact structures, and 0, 1, 2, or 3 intermediate body contact structures (denoted by $N_{bc}$) respectively.

As shown in FIG. 2A, the intermediate and end body contact structures may remove the kink associated with the curve of the reference device. Increasing the number of intermediate body contact structures ($N_{bc}$) increases the linearity of the curves as well as the breakdown voltage (BV).

Figure 2B:
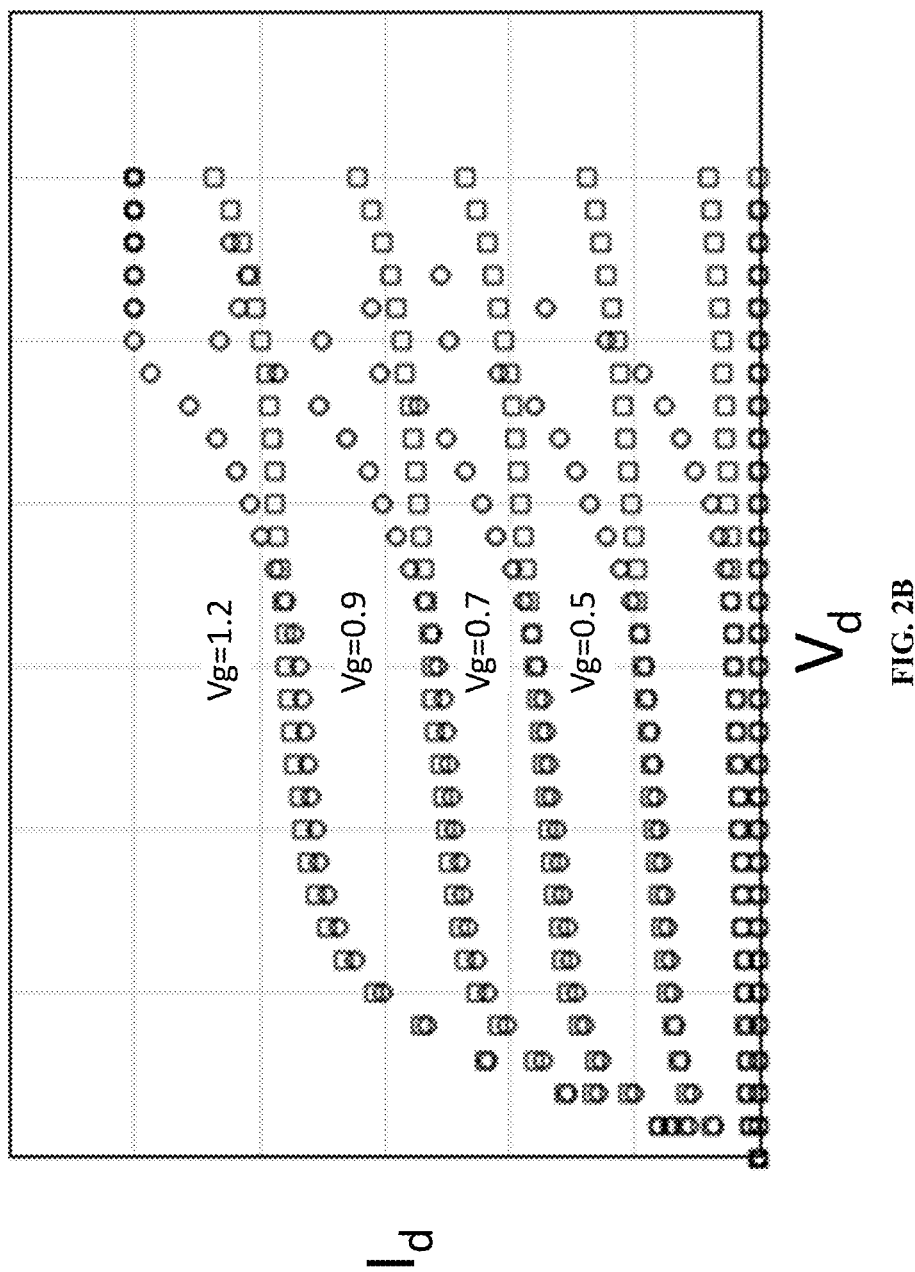
FIG. 2B shows a plot of drain current ($I_d$) as a function of drain voltage ($V_d$) illustrating the $I_d$-$V_d$ curves of a reference device (circles) and the semiconductor device (squares) according to various non-limiting embodiments at different biasing gate voltages ($V_g$)

FIG. 2B shows a plot of drain current ($I_d$) as a function of drain voltage ($V_d$) illustrating the $I_d$-$V_d$ curves of a reference device (circles) and the semiconductor device (squares) according to various non-limiting embodiments at different biasing gate voltages ($V_g$).

Figure 2C:
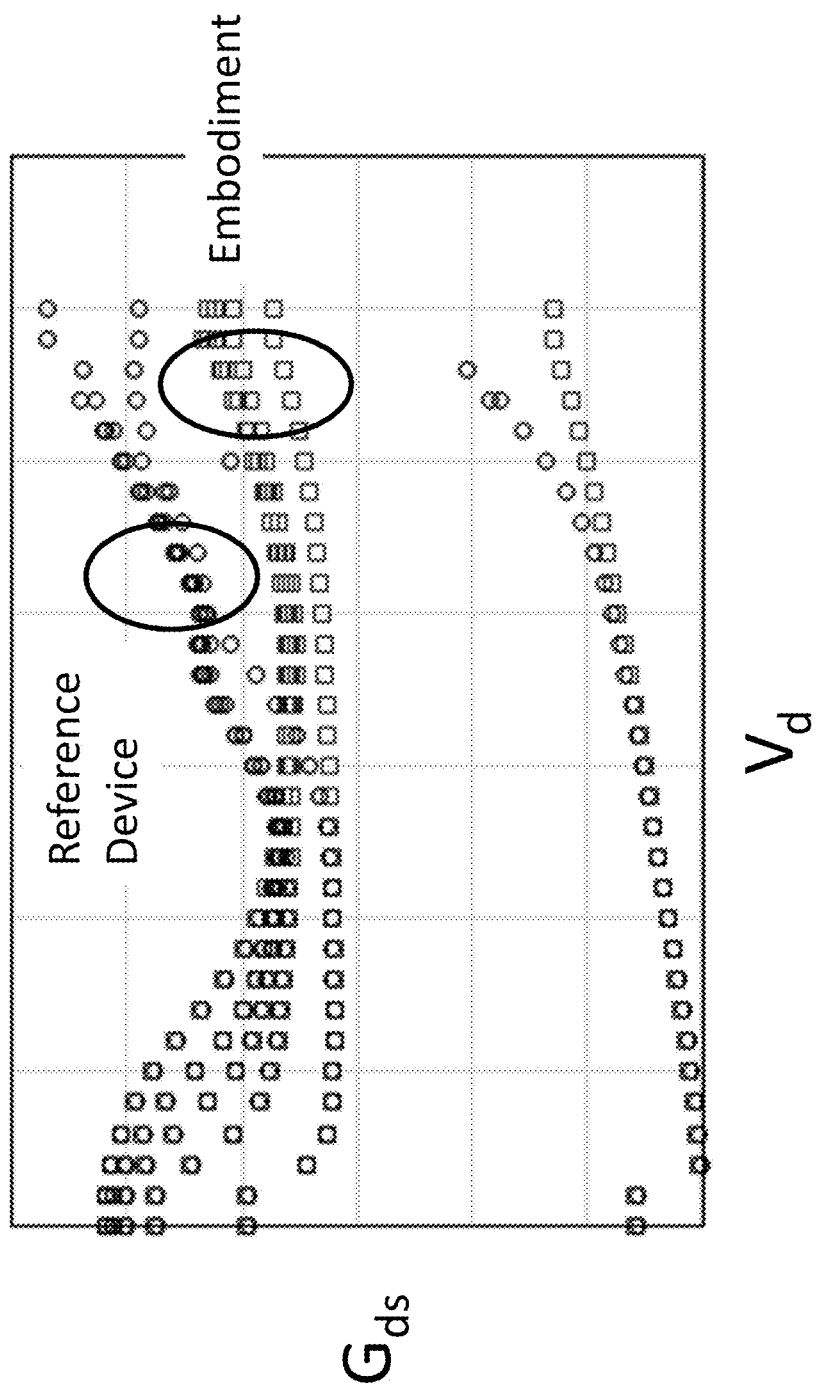
FIG. 2C shows a plot of channel conductance ($G_{ds}$) as a function of drain voltage ($V_d$) illustrating the $G_{ds}$-$V_d$ curves of a reference device (circles) and the semiconductor device (squares) according to various non-limiting embodiments at different biasing gate voltages ($V_g$)

FIG. 2C shows a plot of channel conductance ($G_{ds}$) as a function of drain voltage ($V_d$) illustrating the $G_{ds}$-$V_d$ curves of a reference device (circles) and the semiconductor device (squares) according to various non-limiting embodiments at different biasing gate voltages ($V_g$).

Figure 2D:
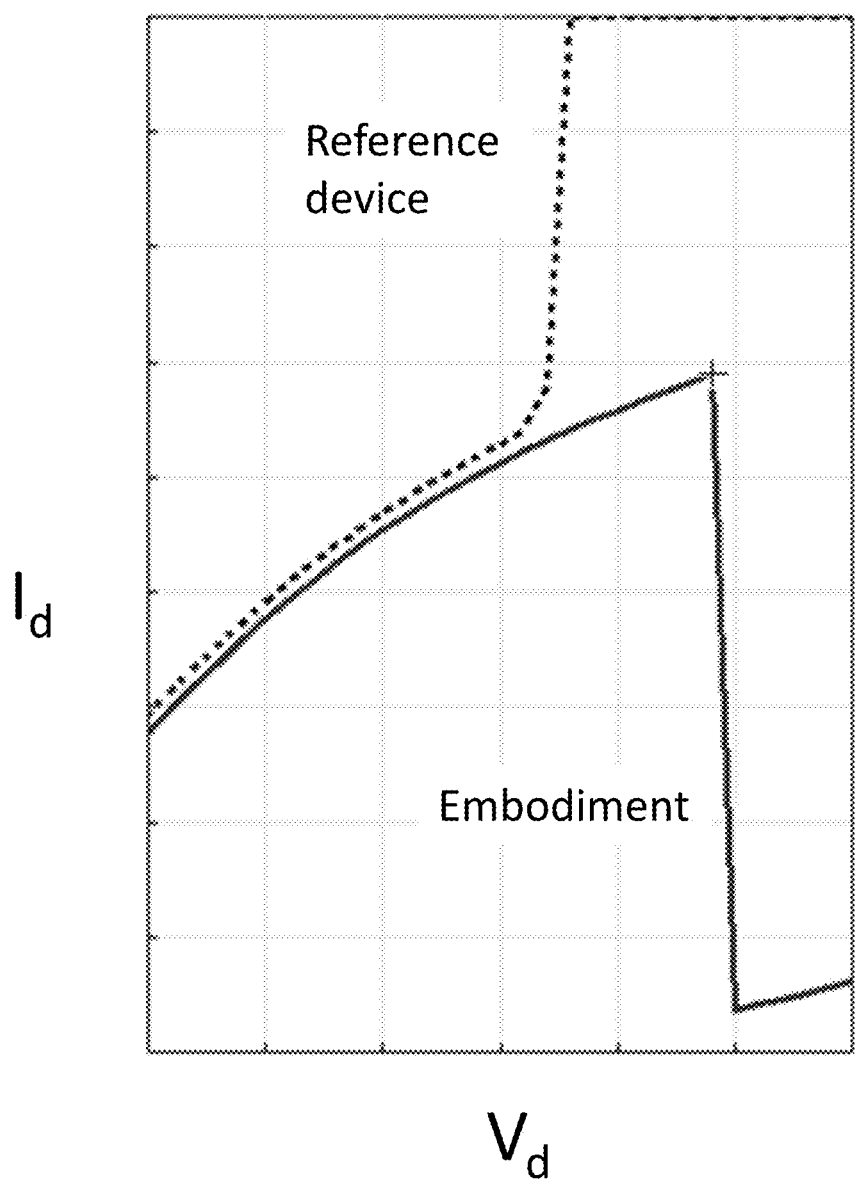
FIG. 2D shows a plot of drain current ($I_d$) as a function of drain voltage ($V_d$) illustrating the $I_d$-$V_d$ curves of a reference device and the semiconductor device according to various non-limiting embodiments when the drain and source are swept in a symmetric breakdown voltage (BV) test.

FIG. 2D shows a plot of drain current ($I_d$) as a function of drain voltage ($V_d$) illustrating the $I_d$-$V_d$ curves of a reference device and the semiconductor device according to various non-limiting embodiments when the drain and source are swept in a symmetric breakdown voltage (BV) test. As shown in FIG. 2D, the semiconductor device shows a higher breakdown voltage.

Figure 3A:
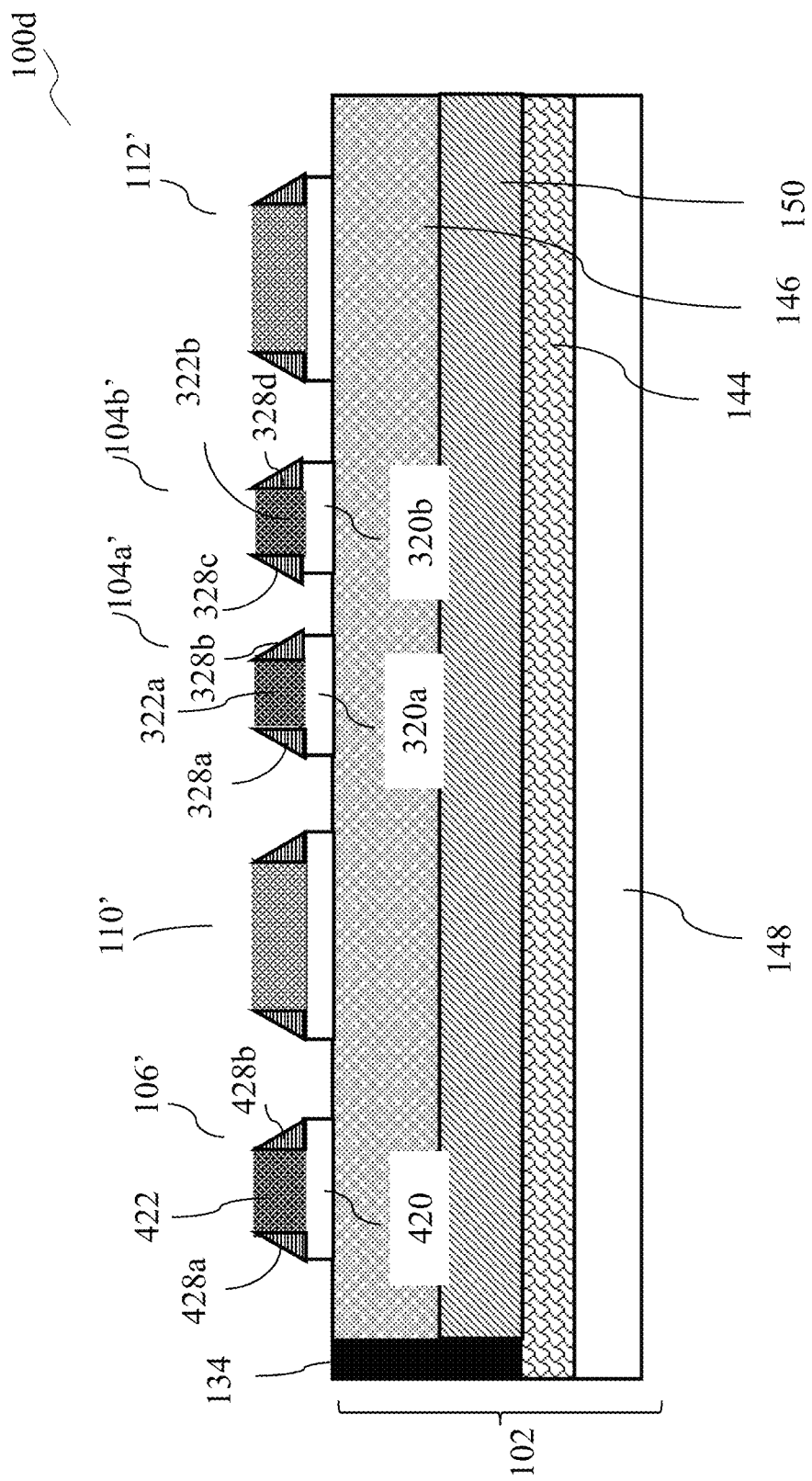
FIG. 3A shows a cross-sectional view of one portion of a semiconductor device 100d during spacer elements formation following standard front end of line (FEOL) processing according to various non-limiting embodiments of the present disclosure.

FIGS. 3A-F illustrate a method of forming a semiconductor device 100*d* according to various non-limiting embodiments of the present disclosure. FIG. 3A shows a cross-sectional view of one portion of a semiconductor device 100*d* during spacer elements formation following standard front end of line (FEOL) processing according to various non-limiting embodiments of the present disclosure. The semiconductor device 110*d* may include a substrate 102 including a crystalline region 148, a buried insulating region 144 over the crystalline region 148, an electrically conductive buried region 150 over the buried insulating region 144, and another crystalline region 146 over the electrically conductive buried region 150. The substrate 102 may also include a trench isolation region 134 over the buried insulating region 144 and adjacent to the electrically conductive buried region 150 and the crystalline layer 146. The electrically conductive buried region 150 and the crystalline region 146 may have a first conductivity type. For instance, the electrically conductive buried region 150 may be a P+ deep implant region, while the crystalline region 146 may be a P-well.

Structures 106', 110', 104*a'*, 104*b'*, 112' may be formed on the substrate 102. The structures 110', 112' may subsequently form conventional transistors, and are not described in detail here for the sake of brevity. The structures 104*a'*, 104*b'* may subsequently form the intermediate body contact structure. Each structure 104*a'* (or 104*b'*) may include a dielectric layer 320*a* (or 320*b*), an electrically conductive layer 322*a* (or 322*b*) on the respective dielectric layer 320*a* (or 320*b*) and a pair of spacer elements 328*a*, 328*b* (or 328*c*, 328*d*) on the respective dielectric layer 320*a* (or 320*b*) such that the electrically conductive layer 322*a* (or 322*b*) is between each pair of spacer elements 328*a*, 328*b* (or 320*c*, 320*d*). The structure 106' may subsequently form the end body contact structure. The structure 106' may include a dielectric layer 420, an electrically conductive layer 422 on the dielectric layer 420 and a pair of spacer elements 428*a*, 428*b* on the dielectric layer 420 such that the electrically conductive layer 422 is between the pair of spacer elements 428*a*, 428*b*. A suitable dielectric material may be deposited and etched to form the spacer elements 328*a*, 328*b* along sidewalls of electrically conductive layer 322*a*, spacer elements 328*c*, 328*d* along the sidewalls of electrically conductive layer 322*b*, spacer elements 428*a*, 428*b* along the side walls of electrically conductive layer 422 as well as the spacers elements along the side walls of electrically conductive layers of structures 110', 112'.

Figure 3B:
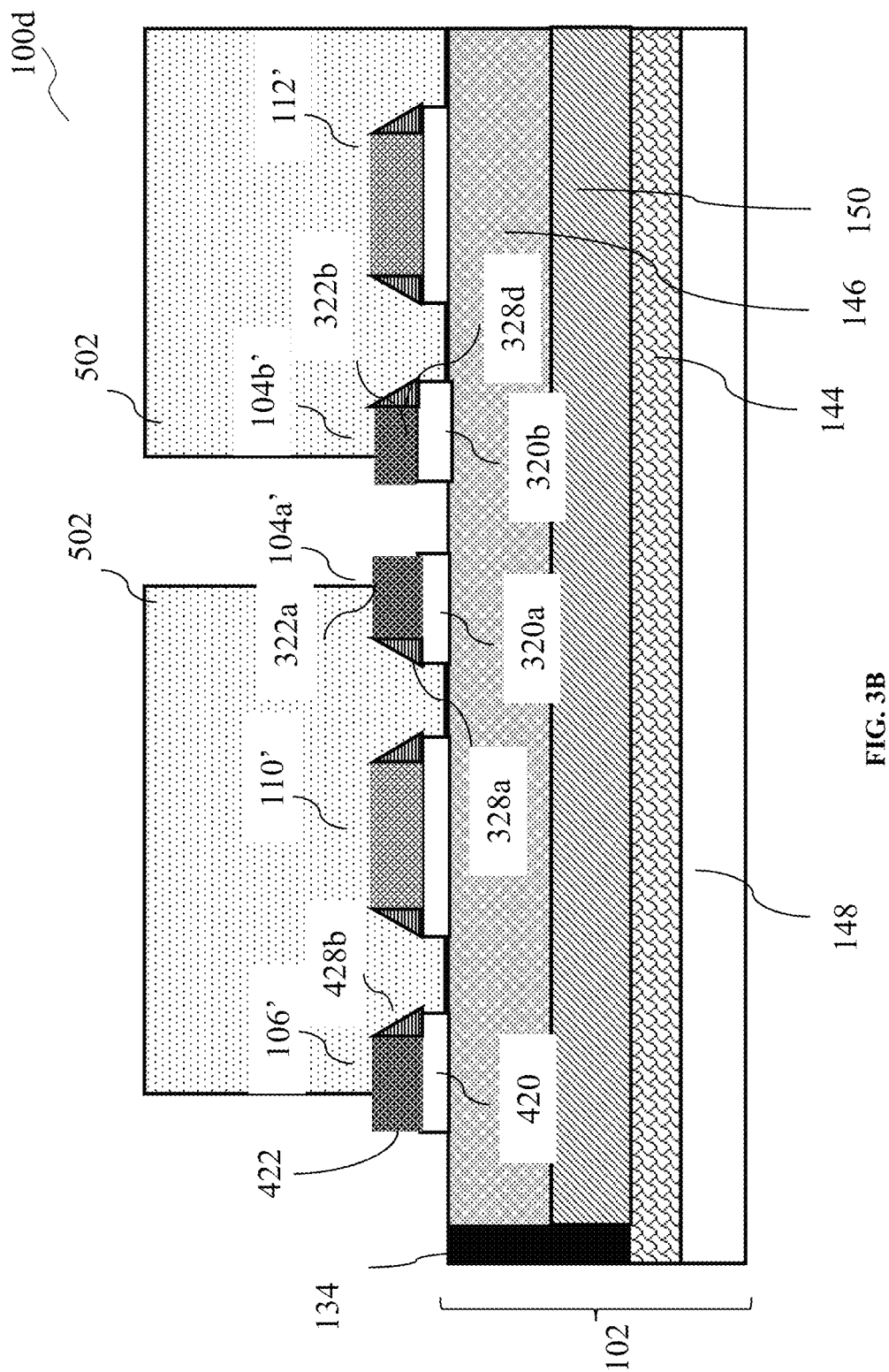
FIG. 3B shows a cross-sectional view of the portion of the semiconductor device 100d in which some spacer elements are removed according to various non-limiting embodiments of the present disclosure.

FIG. 3B shows a cross-sectional view of the portion of the semiconductor device 100*d* in which some spacer elements 328*b*, 328*c*, 428*a* are removed according to various non-limiting embodiments of the present disclosure. A resist material may be deposited and lithography may be carried out to form mask 502 which opens areas where spacer elements 328*b*, 328*c*, 428*a* are to be removed. A suitable etching step, including but not limited to reactive ion etching (RIE), may be carried out to remove the spacer element 328*b* of the structure 104*a'* facing the structure 104*b'*, the spacer element 328*c* of the structure 104*b'* facing the structure 104*a'* as well as the spacer element 428*a* facing the shallow isolation trench region 134. The mask 502 may be removed following the etching step. The portions of the dielectric layers 320*a-b*, 420 under the spacer elements 328*b*, 328*c*, 428*a* may also be removed during etching.

Figure 3C:
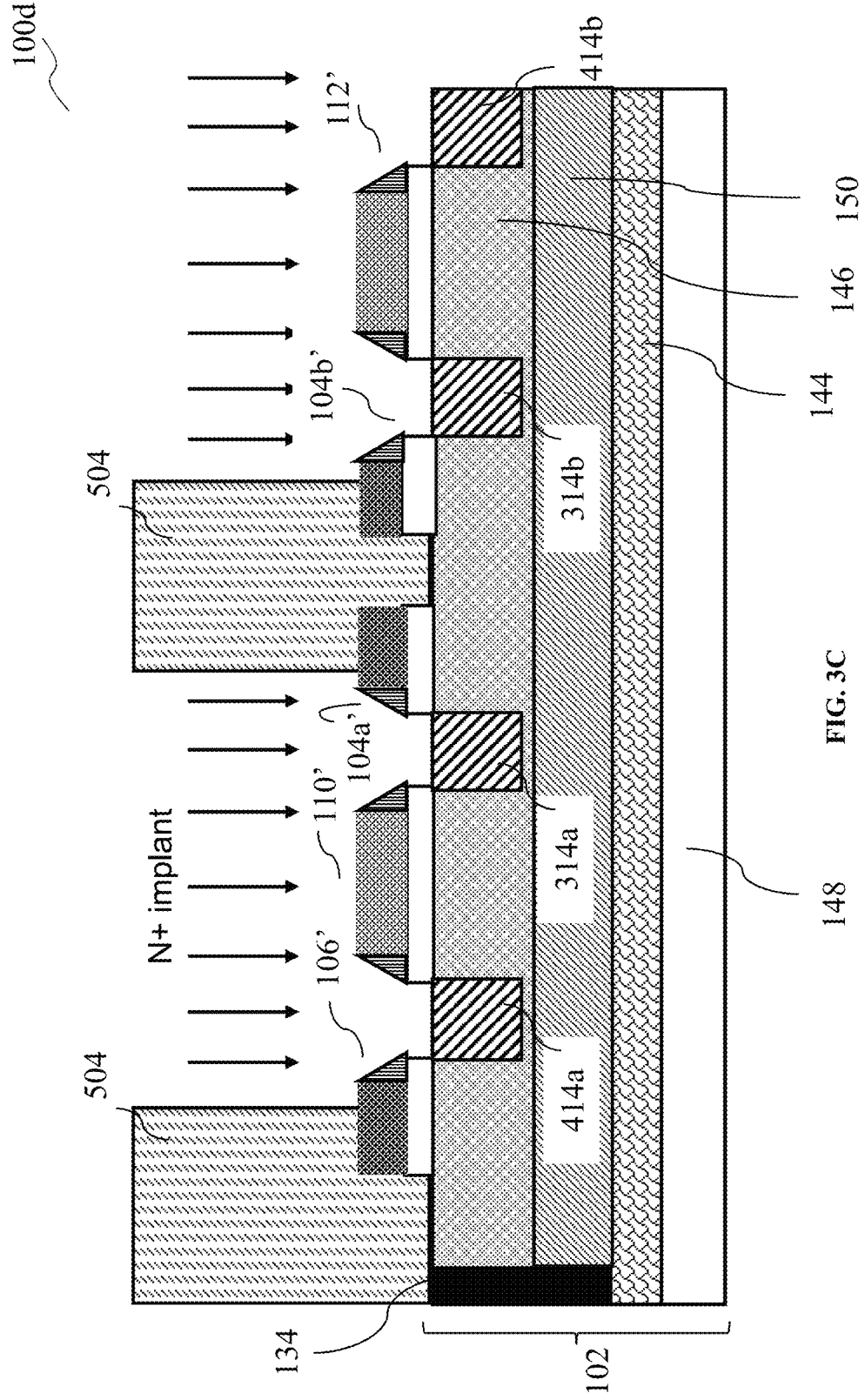
FIG. 3C shows a cross-sectional view of the portion of the semiconductor device 100d during formation of the terminal regions according to various non-limiting embodiments of the present disclosure.

FIG. 3C shows a cross-sectional view of the portion of the semiconductor device 100*d* during formation of the terminal regions 314*a-b*, 414*a-b* according to various non-limiting embodiments of the present disclosure. Resist may be deposited to form another mask 504 such that areas to be doped, e.g. via ion implantation, may be opened. The regions in which the body contact regions are to be subsequently formed are blocked or covered by the mask 504. Doping may be carried out such that terminal regions 314*a-b*, 414*a-b* may have a second conductivity type different from the first conductivity type. For instance, the terminal regions 314*a-b*, 414*a-b* may be N+ wells, and may be formed via a N+ implant. The mask 504 may be removed after forming the terminal regions 314*a-b*, 414*a-b*.

Figure 3D:
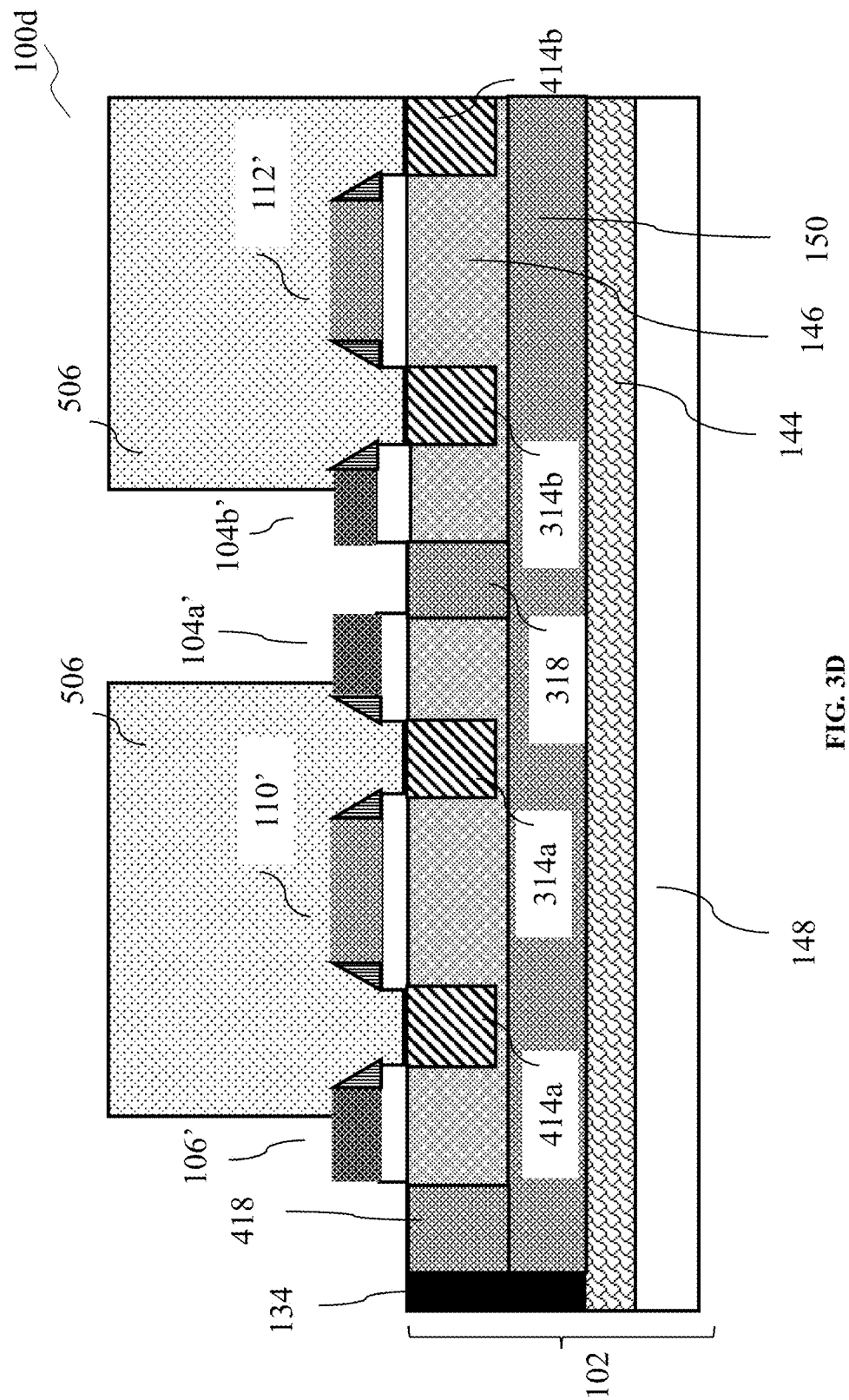
FIG. 3D shows a cross-sectional view of the portion of the semiconductor device 100d during formation of the body contact regions according to various non-limiting embodiments of the present disclosure.

FIG. 3D shows a cross-sectional view of the portion of the semiconductor device 100*d* during formation of the body contact regions 318, 418 according to various non-limiting embodiments of the present disclosure. Resist may be deposited to form a further mask 506 such that areas to be doped, e.g. via ion implantation, may be opened. The electrically conductive layers (e.g. polysilicon layers) of the conventional transistors 110', 112' as well as the terminal regions 314*a-b*, 414*a-b* may be covered or blocked by the mask 506. Doping may be carried out such that the body contact regions 318, 418 may have the first conductivity type. For instance, the body contact regions 318, 418 may be formed via a P+ implant. The mask 506 may be removed after forming the body contact regions 318, 418.

Figure 3E:
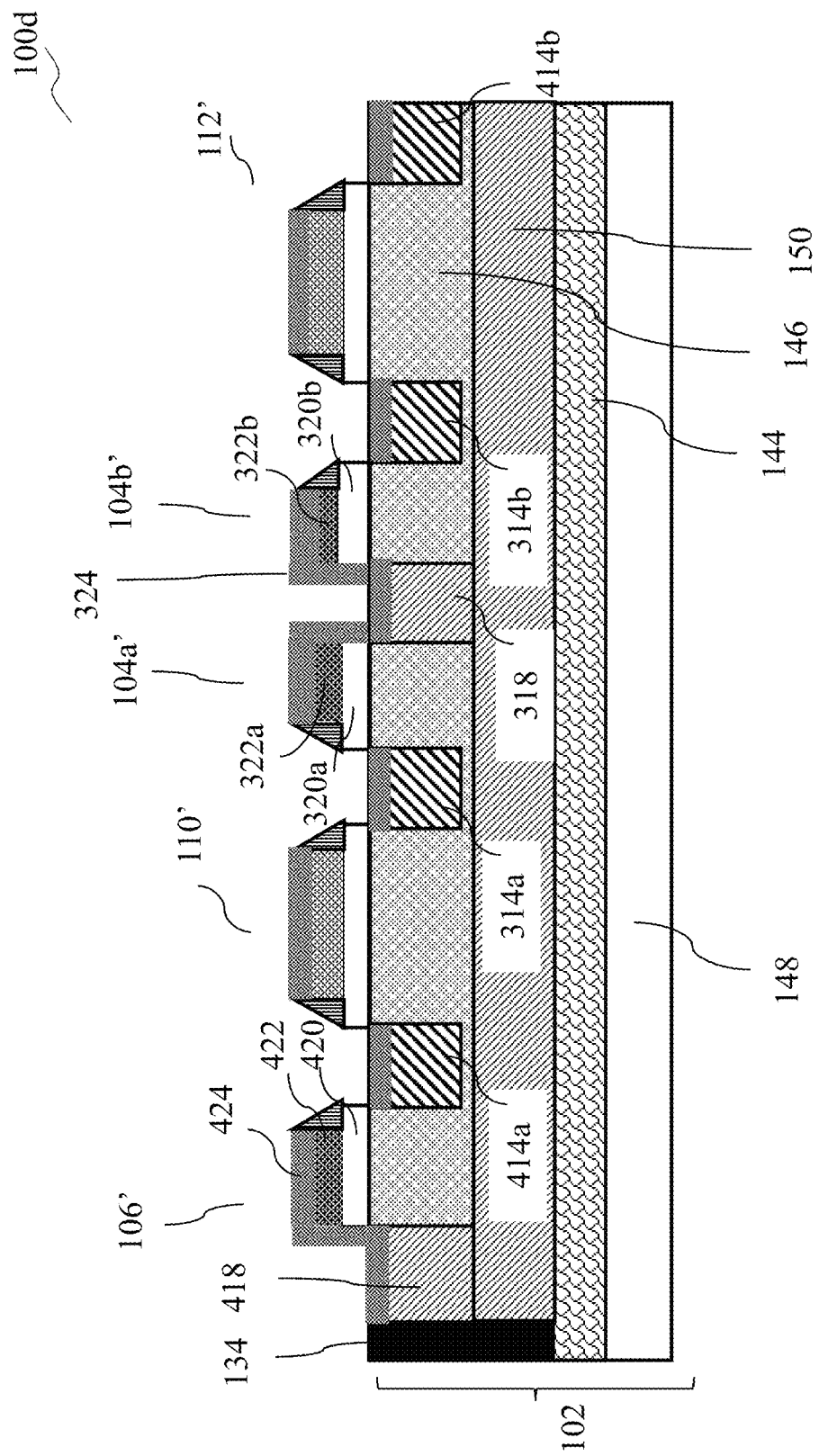
FIG. 3E shows a cross-sectional view of the portion of the semiconductor device 100d during formation of metallic layers according to various non-limiting embodiments of the present disclosure.

FIG. 3E shows a cross-sectional view of the portion of the semiconductor device 100*d* during formation of metallic layers according to various non-limiting embodiments of the present disclosure. The metallic layers may include the continuous metallic layer 324 extending from over the electrically conductive layer 322*a* to the body contact region 318 and further over the electrically conductive layer 322*b*, the continuous metallic layer 424 extending from over the electrically conductive layer 422 to the body contact region 418, as well as the metallic layers over the terminal regions 414a, 314a, 314b and the metallic layers over the electrically conductive layers of conventional transistors 110', 112'. The continuous metallic layer 324 may be in contact with a top portion and a side portion of the electrically conductive layer 322a as well as a top portion and a side portion of the electrically conductive layer 322b. The continuous metallic layer 424 may be in contact with a top portion and a side portion of electrically conductive layer 422. The metallic layers may include a metallic silicide or any other suitable electrically conductive material. For instance, a suitable metal may be deposited over the semiconductor device 100d and annealing may be carried out such that the metallic silicide forms on the exposed silicon surface, i.e. the electrically conductive layers 322a, 322b, the electrically conductive layer 422, the terminal regions 414a, 314a, 314b, the electrically conductive layers of conventional transistors 110', 112 that are not covered by the spacer elements. The dielectric layers 320a-b, 420 present in structures 104a', 104b', 106' may be thin enough such that the metal silicide is able to bridge from the sidewalls to the body contact regions 318, 418. The unreacted metal over the spacer elements may subsequently be removed, e.g. via RIE.

Figure 3F:
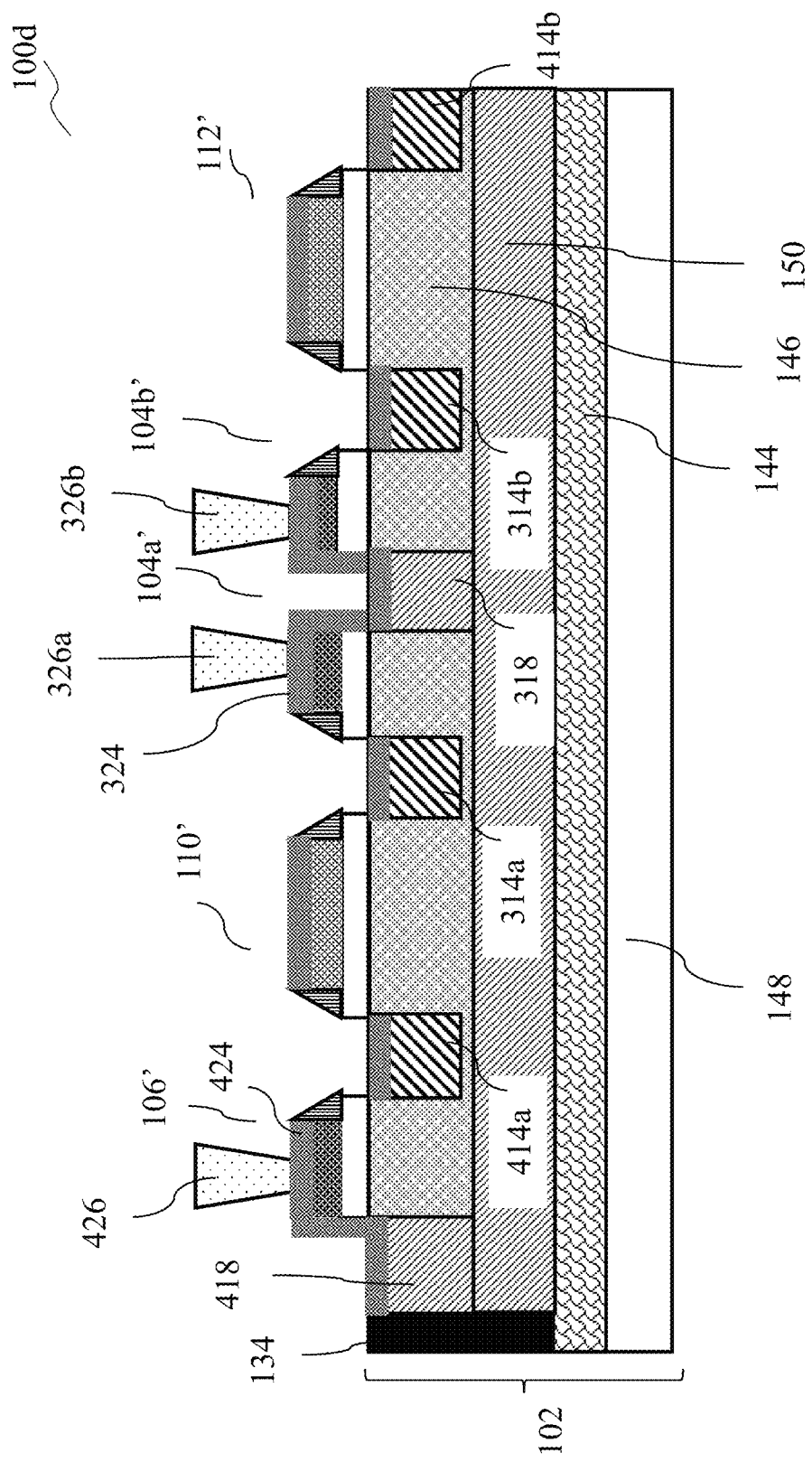
FIG. 3F shows a cross-sectional view of the portion of the semiconductor device 100d during formation of the body contact interconnects according to various non-limiting embodiments of the present disclosure.

FIG. 3F shows a cross-sectional view of the portion of the semiconductor device 100d during formation of the body contact interconnects 326a-b, 426 according to various non-limiting embodiments of the present disclosure. The body contact interconnect 326a may be formed on a portion of the continuous metallic layer 324 over the electrically conductive layer 322a, the body contact interconnect 326b may be formed on another portion of the continuous metallic layer 324 over the electrically conductive layer 322b, while the body contact interconnect 426 may be formed on a portion of the continuous metallic layer 424 over the electrically conductive layer 422.

Figure 4:
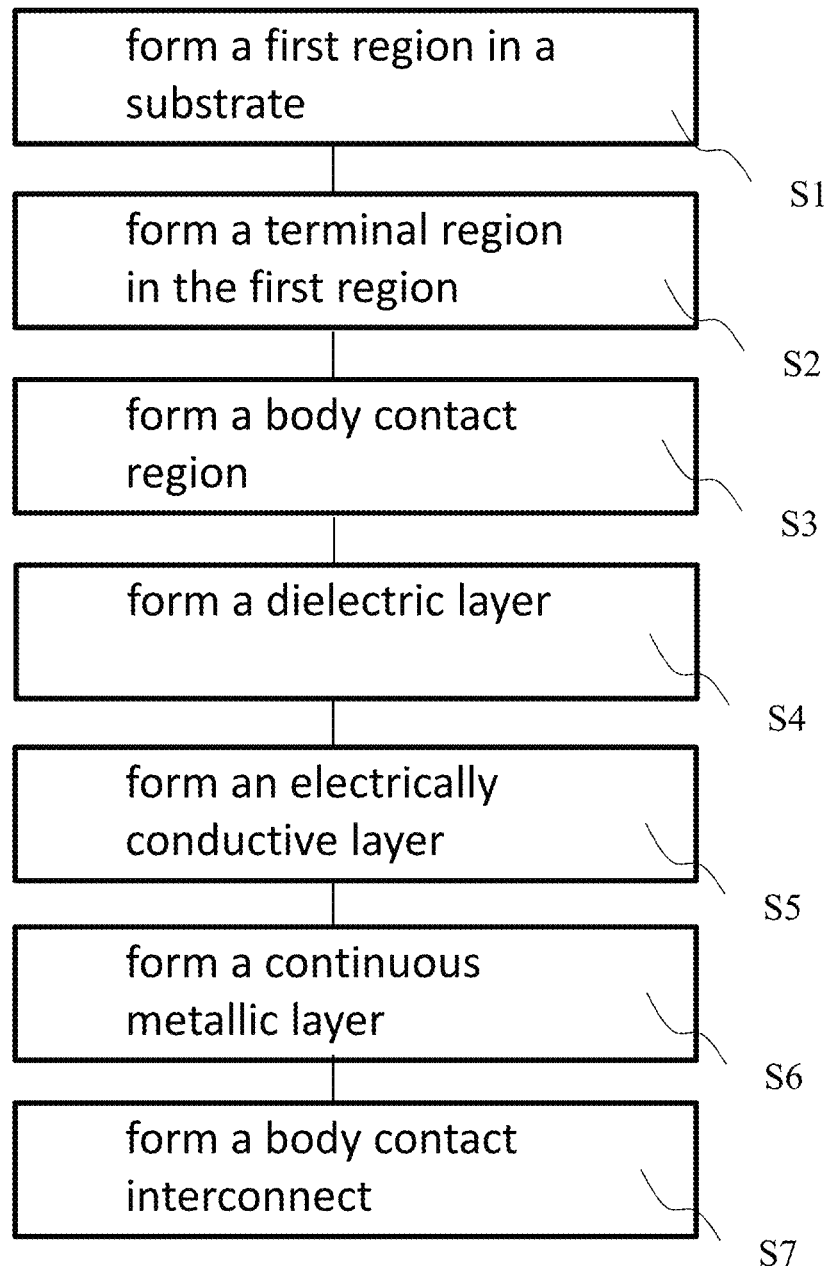
FIG. 4 shows a general illustration of a method of forming a semiconductor device according to various non-limiting embodiments of the present disclosure.

FIG. 4 shows a general illustration of a method of forming a semiconductor device according to various non-limiting embodiments of the present disclosure. The method may include, in S1, forming a first region in a substrate. The method may also include, in S2, forming a terminal region in the first region. The method may further include, in S3, forming a body contact region in the first region and spaced apart from the terminal region. The method may additionally include, in S4, forming a dielectric layer on the substrate over the first region between the terminal region and the body contact region. The method may include, in S5, forming an electrically conductive layer on the dielectric layer. The method may further include, in S6, forming a continuous metallic layer on the electrically conductive layer and extending to the body contact region, the continuous metallic layer in physical contact with a top and side portions of the electrically conductive layer. The method may include, in S7, forming a body contact interconnect on a portion of the continuous metallic layer over the electrically conductive layer. The first region and the body contact region may have a first conductivity type, and the terminal region may have a second conductivity type different than the first conductivity type.

For avoidance of doubt, the steps shown in FIG. 4 may not be in sequence. For instance, in some embodiments, S2 and S3 may occur after S4.

The method may further include forming a second terminal region in the first region spaced apart from the body contact region, so that the body contact region is arranged between the terminal region and the second terminal region. The method may also include forming a second dielectric layer on the substrate over the first region between the second terminal region and the body contact region. The method may further include forming a second electrically conductive layer disposed on the second dielectric layer. The continuous metallic layer may be disposed on the second electrically conductive layer so that the continuous metallic layer further extends from the body contact region to the second electrically conductive layer, the continuous metallic layer in physical contact with a top and side portions of the second electrically conductive layer. The second terminal region may have the second conductivity type.

In various non-limiting embodiments, the method may additionally include forming a second body contact interconnect disposed on a portion of the continuous metallic layer over the second electrically conductive layer.

In various non-limiting embodiments, the method may include forming a spacer element on the dielectric layer and on a side of the electrically conductive layer, wherein the electrically conductive layer is disposed on a first portion of the dielectric layer and the spacer element is disposed on a second portion of the dielectric layer, the first portion nearer to the body contact region and the second portion nearer to the terminal region. In various non-limiting embodiments, the method may also include forming a further spacer element on the dielectric layer and on a further side of the electrically conductive layer which is opposite the side of the electrically conductive layer. The further spacer element and the spacer element may be formed at the same time, but the further spacer element may subsequently be removed.

In various non-limiting embodiments, the method may also include forming a second spacer element on the second dielectric layer and on a side of the second electrically conductive layer, wherein the second electrically conductive layer is disposed on a first portion of the second dielectric layer and the second spacer element is disposed on a second portion of the second dielectric layer, the first portion nearer to the body contact region and the second portion nearer to the terminal region. In various non-limiting embodiments, the method may also include forming a further second spacer element on the dielectric layer and on a further side of the second electrically conductive layer which is opposite the side of the second electrically conductive layer. The further second spacer element and the second spacer element may be formed at the same time, but the further second spacer element may subsequently be removed.

In various non-limiting embodiments, the terminal region and/or the second terminal region may be formed after forming the dielectric layer, the second dielectric layer, the first electrically conductive layer and/or the second electrically conductive region.

Figure 5A:
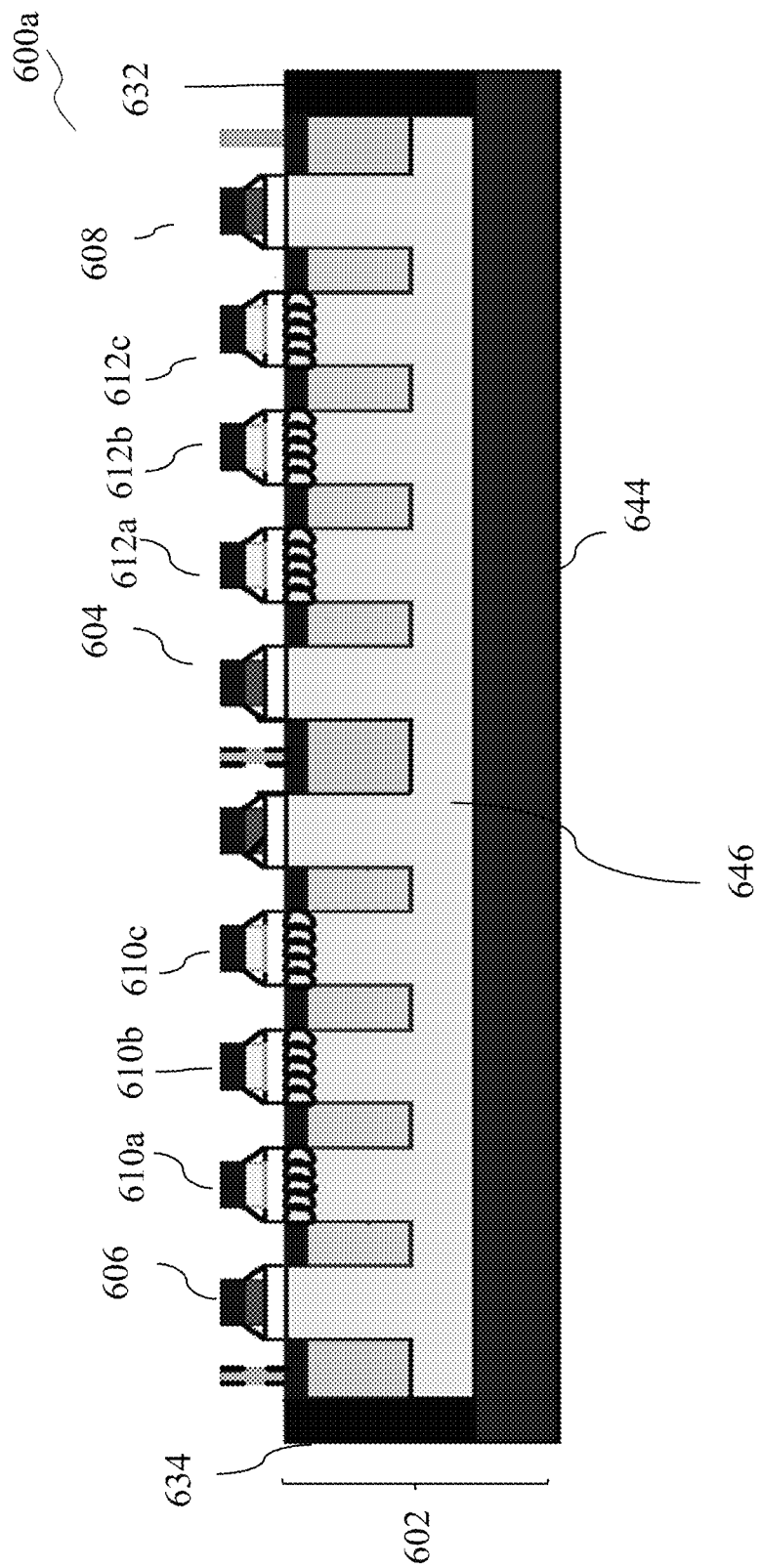
FIG. 5A shows a cross-sectional view of a semiconductor device according to various non-limiting embodiments of the present disclosure.
Figure 5B:
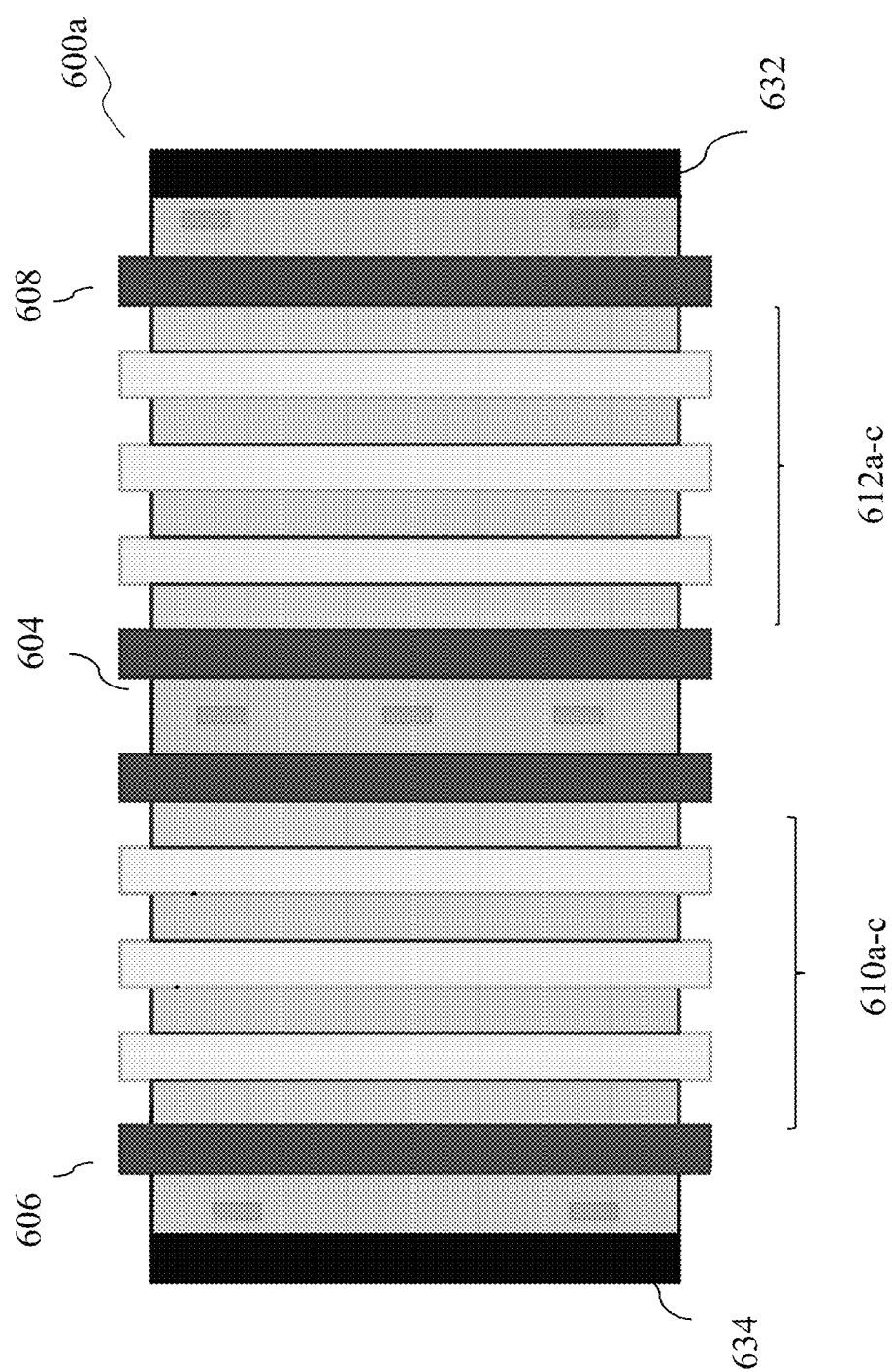
FIG. 5B shows a top planar view of the semiconductor device according to various non-limiting embodiments of the present disclosure.

FIG. 5A shows a cross-sectional view of a semiconductor device 600a according to various non-limiting embodiments of the present disclosure. FIG. 5B shows a top planar view of the semiconductor device 600a according to various non-limiting embodiments of the present disclosure. The semiconductor device 600a may include a substrate 602, first transistors 610a-c, second transistors 612a-c, and intermediate body contact structure 604 between the first transistors 610a-c and the second transistors 612a-c. The first transistors 610a-c and the second transistors 612a-c may be conventional transistors, and are not described in detail here for sake of brevity. The semiconductor device 600a may also include end body contact structures 606, 608 such that the first transistors 610a-c are between the intermediate body contact structure 604 and the end body contact structure 606, while the second transistors 612*a-c* are between the intermediate body contact structure 604 and the end body contact structure 608.

Figure 5C:
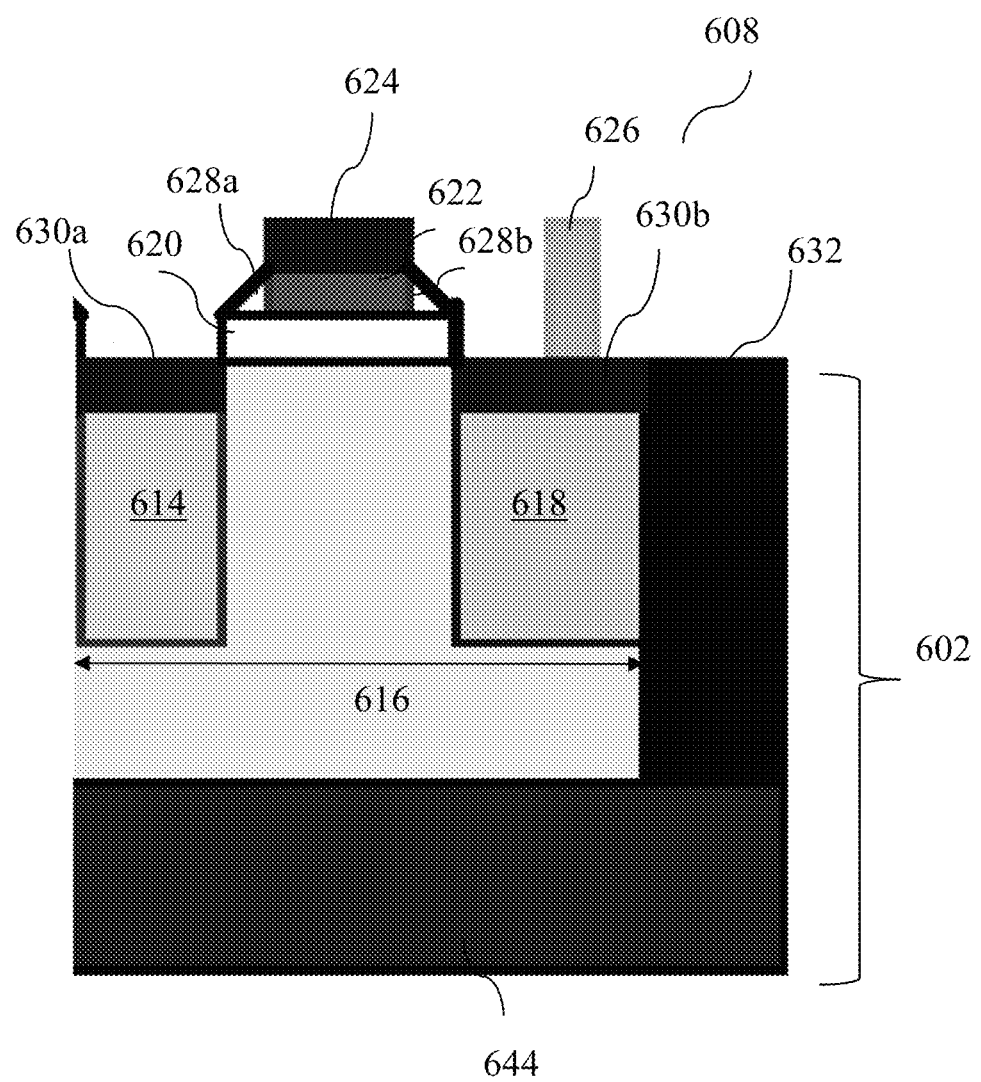
FIG. 5C shows a cross-sectional view the end body contact structure of the semiconductor device according to various non-limiting embodiments of the present disclosure.

FIG. 5C shows a cross-sectional view the end body contact structure 608 according to various non-limiting embodiments of the present disclosure. The end body contact structure 608 may include a region 616 disposed in the substrate 602. The region 616 may include a terminal region 614 disposed in the region 616, and a body contact region 618 disposed in the region 616 and spaced apart from the terminal region 614. The end body contact structure 608 may also include a gate structure including a dielectric layer 620 disposed on the substrate 602 over the region 616 between the terminal region 614 and the body contact region 618. The gate structure may also include a first spacer element 628*a*, a second spacer element 628*b* and an electrically conductive layer 622 disposed on the dielectric layer 620 such that the electrically conductive layer 622 is between the first spacer element 628*a* and the second spacer element 628*b*. The gate structure may further include a metallic layer 624, e.g. a metal silicide layer disposed on the electrically conductive layer 622. The end body contact structure 608 may also include a trench isolation region 632 adjacent to the body contact region 618, on a side of the body contact region 618 facing away from the terminal region 614. The terminal region 614 may be part of transistor 612*c*. There may also be a metallic layer 630*a* disposed on the terminal region 614, and another metallic layer 630*b* disposed on the body contact region 618. The end body contact structure 628 may additionally include body contact interconnect 626 disposed on the metallic layer 630*b*. The gate structure may help to isolate the body contact region 618 from the conventional transistors 612*a-c*. The end body contact structure 606 may have similar features as that of end body contact structure 608.

FIG. 5D shows a cross-sectional view the intermediate body contact structure 604 according to various non-limiting embodiments of the present disclosure. The intermediate body contact structure 604 may include a region 716 disposed in the substrate 602. The region 716 may include a terminal regions 714*a*, 714*b* and body contact region 718. The terminal regions 714*a*, 714*b* may be spaced apart from the body contact region 718, so that the body contact region 718 is arranged between the terminal regions 714*a*, 714*b*. The intermediate body contact structure 604 may also include a first gate structure including a dielectric layer 720*a* disposed on the substrate 702 over the region 716 between the terminal region 714*a* and the body contact region 718, and a second gate structure including a dielectric layer 720*b* disposed on the substrate 702 over the region 716 between the body contact region 718 and the terminal region 714*b*. The first gate structure may also include a first spacer element 728*a*, a second spacer element 728*b* and an electrically conductive layer 722*a* disposed on the dielectric layer 720*a* such that the electrically conductive layer 722*a* is between the first spacer element 728*a* and the second spacer element 728*b*. The second gate structure may also include a first spacer element 728*c*, a second spacer element 728*d* and an electrically conductive layer 722*b* disposed on the dielectric layer 720*b* such that the electrically conductive layer 722*b* is between the first spacer element 728*c* and the second spacer element 728*d*. Additionally, the first gate structure may include a metallic layer 724*a* disposed on the electrically conductive layer 722*a*, while the second gate structure may include a metallic layer 724*b* disposed on the electrically conductive layer 722*b*. The intermediate body contact structure 704 may also include a metallic layer 730*a* disposed on the body contact region 718, a metallic layer 730*b* disposed on the terminal region 714*a* and a metallic layer 730*c* disposed on the terminal region 714*b*. Additionally, the intermediate body contact structure 704 may include a body contact interconnect 726 disposed on the metallic layer 730*a*. The first and second gate structures may help isolate the body contact region 718 from the conventional transistors 610*a-c*, 612*a-c*.

Returning to FIG. 5A, the semiconductor device 600*a* may also include a region 646 which regions 616, 716 are part of. The region 646 may be crystalline. The semiconductor device 600*a* may also include a buried insulating region 644, such as an oxide layer or a buried high resistance region.

Figure 5E:
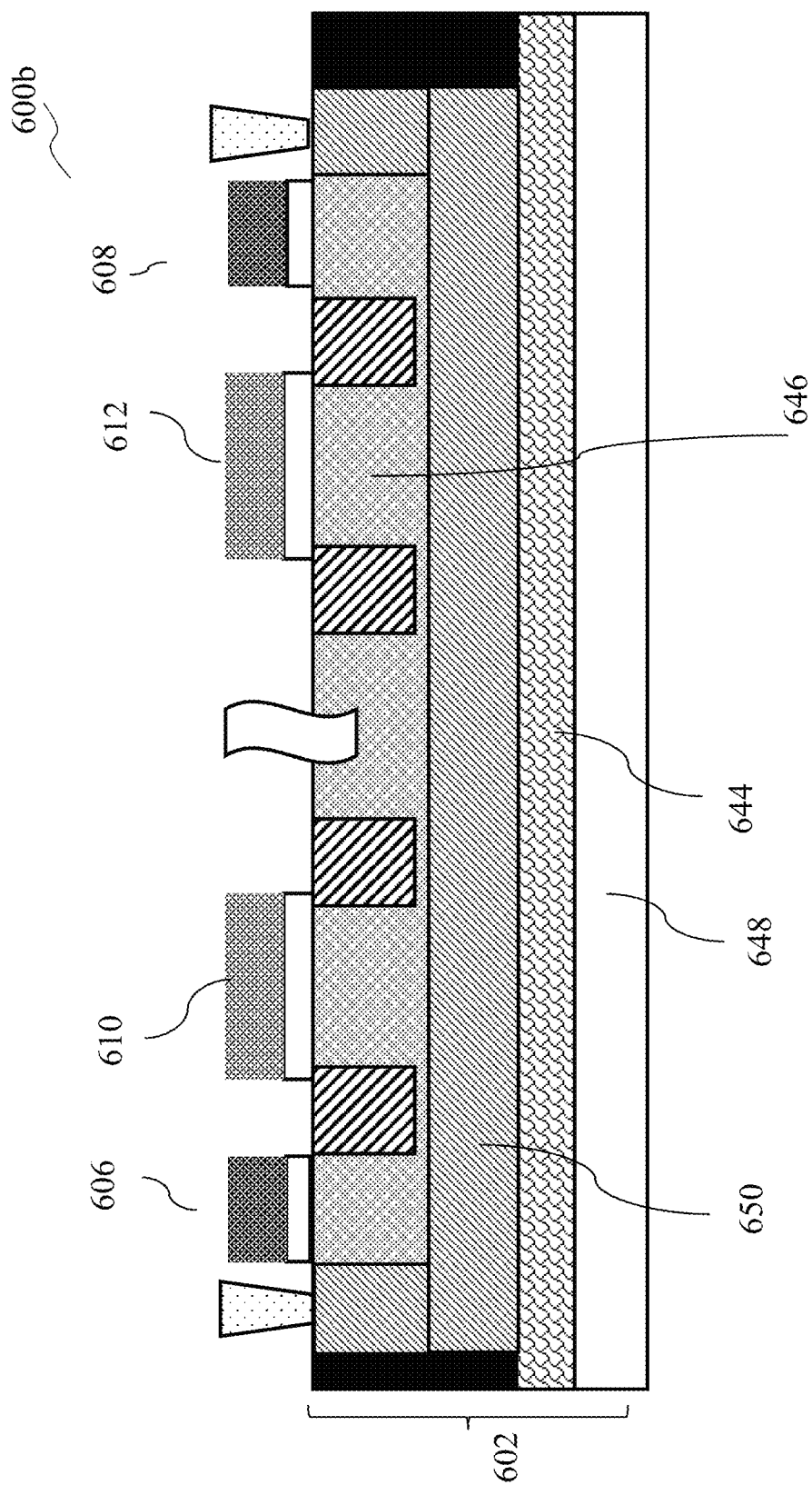
FIG. 5E shows a cross-sectional view of the semiconductor device according to various non-limiting embodiments of the present disclosure.
Figure 5F:
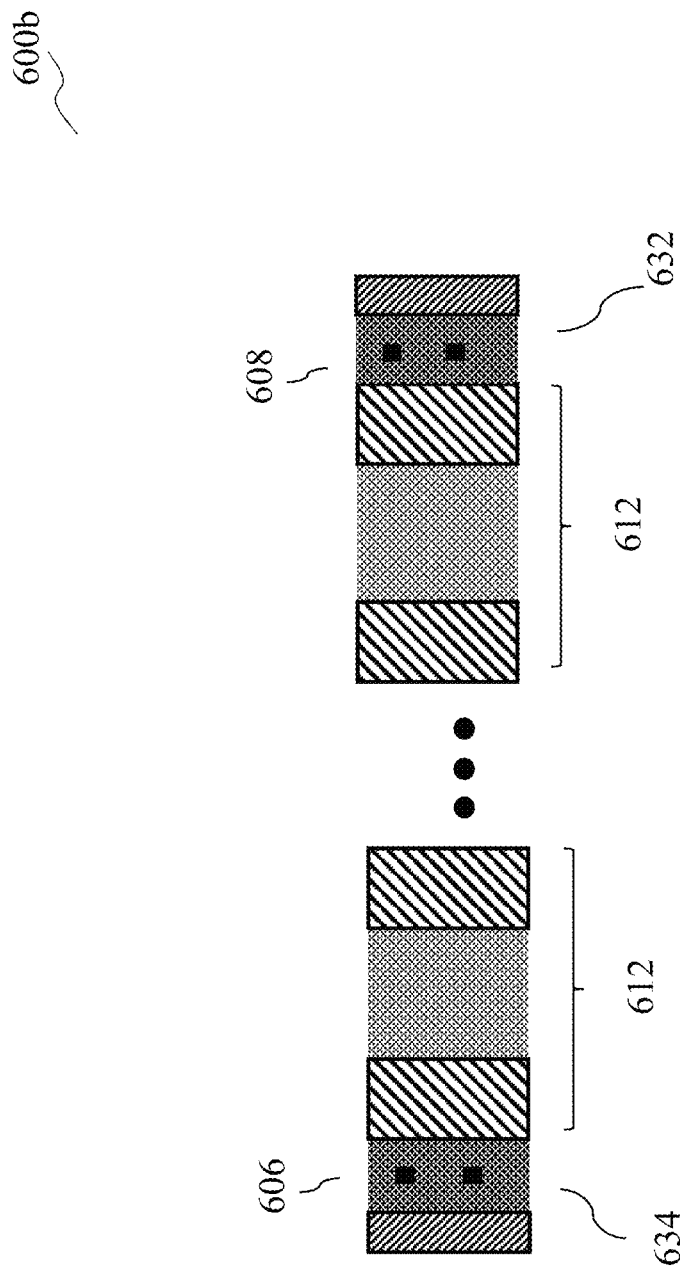
FIG. 5F shows a top planar view of the semiconductor device 600b according to various non-limiting embodiments of the present disclosure.

FIG. 5E shows a cross-sectional view of a semiconductor device 600*b* according to various non-limiting embodiments of the present disclosure. FIG. 5F shows a top planar view of the semiconductor device 600*b* according to various non-limiting embodiments of the present disclosure. The middle portion of the semiconductor device 600*b* including the intermediate body contact structure is not shown. In various non-limiting embodiments, the semiconductor device 600*b* may further include one or more intermediate contact structures between end body contact structures 606, 608. In addition, the semiconductor device 600*b* may be similar to the semiconductor device 600*a*, but may further include an electrically conductive buried region 650 of the substrate 602 in electrical connection with the body contact regions of the end body contact structures 606, 608 as well as the body contact region of the intermediate body contact structure. The substrate 602 may include a crystalline region 648 which the buried insulating region 644 may be disposed on. The electrically conductive buried region 650 may be disposed on the buried insulating region 644, while region 646 may be disposed on the electrically conductive buried region 650.

The body contact regions of semiconductor devices 100*a-c* illustrated by FIGS. 1A-G may be smaller than the body contact regions of semiconductor devices 600*a-b* illustrated by FIGS. 5A-F. The body contact regions of semiconductor devices 100*a-c* may be smaller than the body contact regions of semiconductor devices 600*a-b* by greater than 50%. The total area (i.e. the area occupied by the transistors with the body contact structures) of semiconductor devices 100*a-c* may be smaller than the total area of semiconductor devices (600*a-b*), e.g. by about 20%. For semiconductor devices 600*a-b*, the body contact interconnects may be on the metallic layers over the body contact regions (see FIGS. 5A-F) while for semiconductor devices 100*a-c*, the body contact interconnects may be on portions of the continuous metallic layers over the electrically conductive layers (see FIGS. 1A-G). Accordingly, the body contact regions of semiconductor devices 600*a-b* may be required to be larger to accommodate the body contact interconnects.

Additionally, the channel conductance ($G_{ds}$) may be improved. For instance, at drain voltage of 2.5V, various non-limiting embodiments may improve channel conductance by about an order. The radio frequency (RF) performance in various non-limiting embodiments may be close to that of floating body devices.

Figure 6:
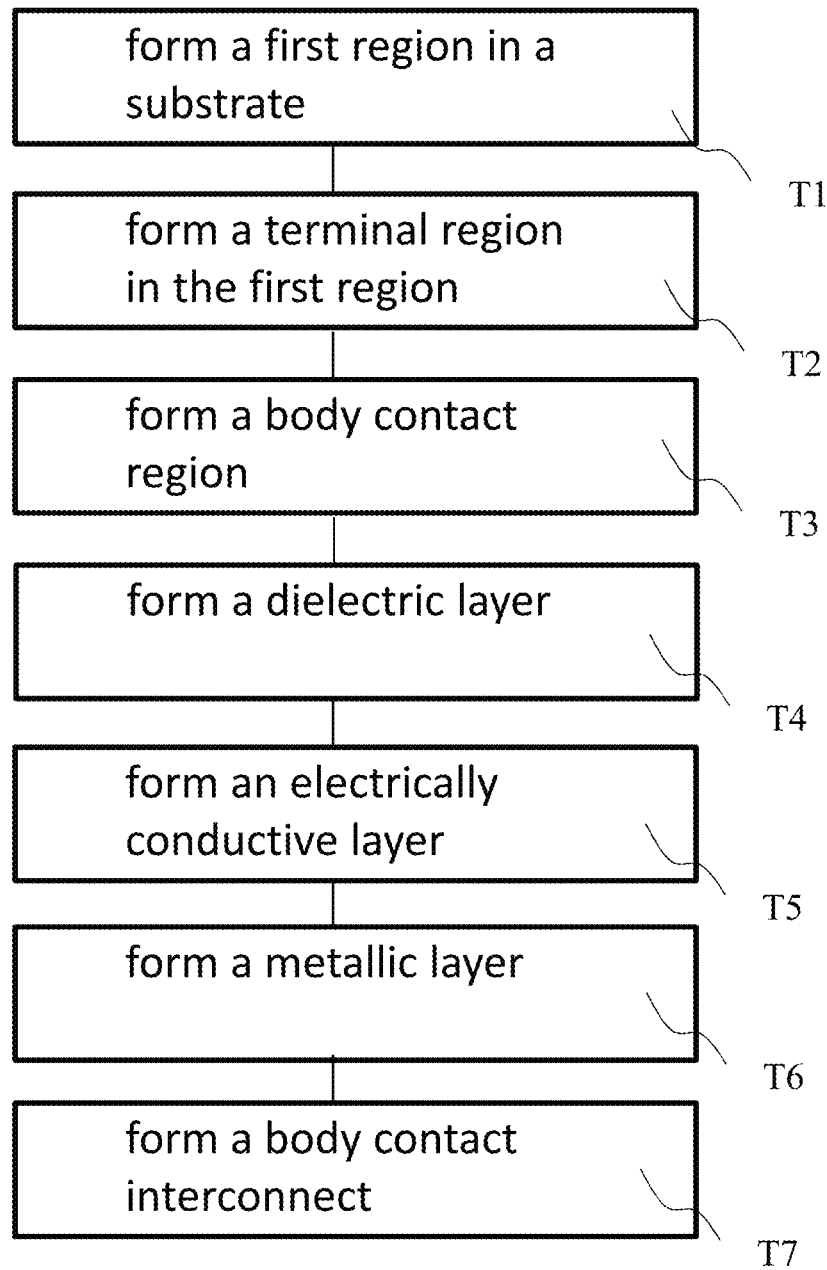
FIG. 6 shows a general illustration of a method of forming a semiconductor device according to various non-limiting embodiments of the present disclosure.

FIG. 6 shows a general illustration of a method of forming a semiconductor device according to various non-limiting embodiments of the present disclosure. The method may include, in T1, forming a first region in a substrate. The method may also include, in T2, forming a terminal region in the first region. The method may further include, in T3, forming a body contact region in the first region and spaced apart from the terminal region. The method may include, in T4, forming a dielectric layer on the substrate over the first region between the terminal region and the body contact region. The method may further include, in T5, forming an electrically conductive layer on the dielectric layer. The method may also include, in T6 forming a metallic layer on the body contact region. The method may additionally include, in T7, forming a body contact interconnect on the metallic layer.

For avoidance of doubt, the steps shown in FIG. 6 may not be in sequence. For instance, in some embodiments, T2 and T3 may occur after T4.

In various non-limiting embodiments, the method may further include forming a second terminal region in the first region spaced apart from the body contact region, so that the body contact region is arranged between the terminal region and the second terminal region. The method may also include forming a second dielectric layer on the substrate over the first region between the second terminal region and the body contact region. The method may further include forming a second electrically conductive layer disposed on the second dielectric layer. The second terminal region may have the second conductivity type.

In various non-limiting embodiments, the method may also include forming a second metallic layer on the electrically conductive layer, a third metallic layer on the second electrically conductive layer, a fourth metallic layer on the terminal region and/or a fifth metallic region on the second terminal region.

Various embodiments may relate to using dummy polysilicon to mask source/drain dopants in the body contact region. In various embodiments, dummy polysilicon may be used as body contact. Various embodiments may include symmetric source drain regions.

The disclosure may be embodied in other specific forms without departing from the spirit or essential characteristics thereof. The foregoing embodiments, therefore, are to be considered in all respects illustrative rather than limiting the disclosure described herein. Scope of the disclosure is thus indicated by the appended claims, rather than by the foregoing description, and all changes that come within the meaning and range of equivalency of the claims are intended to be embraced therein.

The invention claimed is:
1. A semiconductor device comprising:
a substrate;
a first region disposed in the substrate;
a terminal region disposed in the first region;
a body contact region disposed in the first region and spaced apart from the terminal region;
a dielectric layer disposed on the substrate over the first region between the terminal region and the body contact region;
an electrically conductive layer disposed on the dielectric layer;
a continuous metallic layer disposed on the electrically conductive layer and extending to the body contact region, the continuous metallic layer is disposed on the body contact region and in physical contact with a top and side portions of the electrically conductive layer; and
a body contact interconnect disposed on a portion of the continuous metallic layer over the electrically conductive layer,
wherein the first region and the body contact region have a first conductivity type, and the terminal region has a second conductivity type different than the first conductivity type.

2. The semiconductor device of claim 1, further comprising:
a second terminal region disposed in the first region and spaced apart from the body contact region, so that the body contact region is arranged between the terminal region and the second terminal region;
a second dielectric layer disposed on the substrate over the first region between the second terminal region and the body contact region;
a second electrically conductive layer disposed on the second dielectric layer;
wherein the continuous metallic layer is disposed on the second electrically conductive layer so that the continuous metallic layer further extends from the body contact region to the second electrically conductive layer, the continuous metallic layer in physical contact with a top and side portions of the second electrically conductive layer; and
wherein the second terminal region has the second conductivity type.

3. The semiconductor device of claim 2, further comprising:
a second body contact interconnect disposed on a portion of the continuous metallic layer over the second electrically conductive layer.

4. The semiconductor device of claim 1, wherein the continuous metallic layer comprises a metal silicide.

5. The semiconductor device of claim 1, wherein the dielectric layer comprises an oxide and the electrically conductive layer comprises polysilicon.

6. The semiconductor device of claim 2, further comprising:
a spacer element disposed on the dielectric layer and on a side of the electrically conductive layer, wherein the electrically conductive layer is disposed on a first portion of the dielectric layer and the spacer element is disposed on a second portion of the dielectric layer, the first portion nearer to the body contact region and the second portion nearer to the terminal region.

7. The semiconductor device of claim 1, further comprising:
a trench isolation region disposed adjacent to the body contact region, on a side of the body contact region facing away from the terminal region.

8. The semiconductor device of claim 6, further comprising:
a second spacer element disposed on the second dielectric layer and on a side of the second electrically conductive layer, wherein the second electrically conductive layer is disposed on a first portion of the second dielectric layer and the second spacer element is disposed on a second portion of the second dielectric layer, the first portion nearer to the body contact region and the second portion nearer to the terminal region.

9. The semiconductor device of claim 2, wherein the terminal region is part of a first array of transistors and the second terminal region is part of a second array of transistors.

10. The semiconductor device of claim 9,
wherein each transistor of the first array of transistors comprises a gate structure extending in parallel to the first electrically conductive layer and to the second electrically conductive layer; and wherein each transistor of the second array of transistors comprises a gate structure extending in parallel to the first electrically conductive layer and to the second electrically conductive layer.

11. The semiconductor device of claim 9,
wherein transistors in the first array of transistors and transistors in the second array of transistors are fingers of a multifinger transistor structure.

12. The semiconductor device of claim 9, further comprising:
a second region disposed in the substrate;
a third terminal region disposed in the second region;
a second body contact region disposed in the second region and spaced apart from the third terminal region;
a third dielectric layer disposed on the substrate over the second region between the third terminal region and the second body contact region;
a third electrically conductive layer disposed on the third dielectric layer;
a second continuous metallic layer disposed on the third electrically conductive layer and extending to the second body contact region, the second continuous metallic layer in physical contact with a top and side portions of the third electrically conductive layer; and
a third body contact interconnect disposed on a portion of the second continuous metallic layer over the third electrically conductive layer,
wherein the second region and the second body contact region have the first conductivity type, and the third terminal region has the second conductivity type.

13. The semiconductor device of claim 12,
wherein the third terminal region is part of the first array of transistors such that the first array of transistors is between the first body contact region and the second body contact region.

14. The semiconductor device of claim 12, further comprising:
a third region disposed in the substrate;
a fourth terminal region disposed in the third region;
a third body contact region disposed in the third region and spaced apart from the fourth terminal region;
a fourth dielectric layer disposed on the substrate over the third region between the fourth terminal region and the third body contact region;
a fourth electrically conductive layer disposed on the third dielectric layer;
a third continuous metallic layer disposed on the fourth electrically conductive layer and extending to the third body contact region, the third continuous metallic layer in physical contact with a top and side portions of the fourth electrically conductive layer; and
a fourth body contact interconnect disposed on a portion of the third continuous metallic layer over the fourth electrically conductive layer,
wherein the third region and the third body contact region have the first conductivity type, and the fourth terminal region has the second conductivity type.

15. The semiconductor device of claim 14,
wherein the fourth terminal region is part of the second array of transistors such that the second array of transistors is between the first body contact region and the third body contact region.

16. The semiconductor device of claim 1, further comprising:
a buried high resistance or high impedance region, or an oxide layer in the substrate under the first region.

17. The semiconductor device of claim 16, further comprising:
an electrically conductive buried region of the substrate in electrical connection with the body contact region.

18. A method of forming a semiconductor device, the method comprising:
forming a first region in a substrate;
forming a terminal region in the first region;
forming a body contact region in the first region and spaced apart from the terminal region;
forming a dielectric layer on the substrate over the first region between the terminal region and the body contact region;
forming an electrically conductive layer on the dielectric layer;
forming a continuous metallic layer on the electrically conductive layer and extending to the body contact region, the continuous metallic layer is disposed on the body contact region and in physical contact with a top and side portions of the electrically conductive layer; and
forming a body contact interconnect on a portion of the continuous metallic layer over the electrically conductive layer,
wherein the first region and the body contact region have a first conductivity type, and the terminal region has a second conductivity type different than the first conductivity type.

19. A semiconductor device comprising:
a substrate;
a first region disposed in the substrate;
a first terminal region and a second terminal region disposed in the first region;
a body contact region disposed in the first region, the first terminal region and the second terminal region spaced apart from the body contact region so that the body contact region is arranged between the first terminal region and the second terminal region;
a first dielectric layer disposed on the substrate over the first region between the first terminal region and the body contact region;
a second dielectric layer disposed on the substrate over the first region between the body contact region and the second terminal region;
a first spacer element, a second spacer element and a first electrically conductive layer disposed on the first dielectric layer such that the first electrically conductive layer is between the first spacer element and the second spacer element;
a third spacer element, a fourth spacer element and a second electrically conductive layer disposed on the second dielectric layer such that the second electrically conductive layer is between the third spacer element and the fourth spacer element;
a metallic layer disposed on the body contact region; and
a body contact interconnect disposed on the metallic layer,
wherein the first region and the body contact region have a first conductivity type, and the first terminal region and the second terminal region have a second conductivity type different than the first conductivity type.

20. The semiconductor device according to claim 19,
wherein the first terminal region is part of a first array of transistors and the second terminal region is part of a second array of transistors.

* * * * *